United States Patent
Ochi et al.

(10) Patent No.: US 10,263,016 B2
(45) Date of Patent: Apr. 16, 2019

(54) ACTIVE MATRIX SUBSTRATE AND METHOD FOR PRODUCING THE SAME

(71) Applicant: Sharp Kabushiki Kaisha, Sakai, Osaka (JP)

(72) Inventors: Hisao Ochi, Sakai (JP); Tohru Daitoh, Sakai (JP); Hajime Imai, Sakai (JP); Tetsuo Fujita, Sakai (JP); Hideki Kitagawa, Sakai (JP); Tetsuo Kikuchi, Sakai (JP); Masahiko Suzuki, Sakai (JP); Teruyuki Ueda, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/775,026

(22) PCT Filed: Jan. 26, 2017

(86) PCT No.: PCT/JP2017/002696
§ 371 (c)(1),
(2) Date: May 10, 2018

(87) PCT Pub. No.: WO2017/131078
PCT Pub. Date: Aug. 3, 2017

(65) Prior Publication Data
US 2018/0277574 A1    Sep. 27, 2018

(30) Foreign Application Priority Data

Jan. 28, 2016 (JP) .................................. 2016-014104

(51) Int. Cl.
*H01L 27/12* (2006.01)
*H01L 29/786* (2006.01)
(Continued)

(52) U.S. Cl.
CPC ...... *H01L 27/1225* (2013.01); *G02F 1/13624* (2013.01); *H01L 21/441* (2013.01);
(Continued)

(58) Field of Classification Search
CPC . H01L 27/1225; H01L 27/12; H01L 27/1251; H01L 27/1262; H01L 27/127;
(Continued)

(56) References Cited

U.S. PATENT DOCUMENTS 8,283,859 B2 * 10/2012 Amano .................. H05B 33/04
313/506
8,710,734 B2 *  4/2014 Amano .................. H05B 33/04
313/504
(Continued)

FOREIGN PATENT DOCUMENTS

JP    2008-085048 A    4/2008
WO   2014/069529 A1   5/2014

*Primary Examiner* — Chuong A Luu
(74) *Attorney, Agent, or Firm* — Keating & Bennett, LLP

(57) ABSTRACT

An active matrix substrate includes a first TFT (10), a second TFT (20) disposed per pixel, and a circuit including the first TFT. The first and second TFTs each include a gate electrode (102A, 102B), a gate insulating layer (103), an oxide semiconductor layer (104A, 104B), and source and drain electrodes in contact with an upper surface of the oxide semiconductor layer. The oxide semiconductor layer (104A, 104B) has a stacked structure including a first semiconductor layer (104e, 104c) in contact with the source and drain electrodes and a second semiconductor layer that is disposed on a substrate-side of the first semiconductor layer and that has a smaller energy gap than the first semiconductor layer. The oxide semiconductor layers (104A) and (104B) are different from each other in terms of the composition and/or the number of stacked layers. The first TFT has a larger threshold voltage than the second TFT.

20 Claims, 9 Drawing Sheets (a)

(b)

(51) Int. Cl.
*G02F 1/1362* (2006.01)
*H01L 21/441* (2006.01)
*H01L 29/24* (2006.01)
*H01L 29/45* (2006.01)
*H01L 29/66* (2006.01)
*G02F 1/1368* (2006.01)
*G02F 1/1345* (2006.01)
*H01L 21/02* (2006.01)

(52) U.S. Cl.
CPC ........ *H01L 27/127* (2013.01); *H01L 27/1251* (2013.01); *H01L 27/1262* (2013.01); *H01L 29/24* (2013.01); *H01L 29/45* (2013.01); *H01L 29/66969* (2013.01); *H01L 29/786* (2013.01); *H01L 29/7869* (2013.01); *H01L 29/78696* (2013.01); *G02F 1/1368* (2013.01); *G02F 1/13454* (2013.01); *G02F 2202/10* (2013.01); *H01L 21/02472* (2013.01); *H01L 21/02483* (2013.01); *H01L 21/02505* (2013.01); *H01L 21/02554* (2013.01); *H01L 21/02565* (2013.01)

(58) Field of Classification Search
CPC ....... H01L 29/786; H01L 29/24; H01L 29/45; H01L 29/66; H01L 29/7869; H01L 29/78696; H01L 29/66969; H01L 29/66742; H01L 29/78681
USPC .......................................................... 257/43
See application file for complete search history.

(56) References Cited

U.S. PATENT DOCUMENTS

2008/0073653 A1 3/2008 Iwasaki
2015/0293546 A1 10/2015 Tanaka et al.

* cited by examiner (a)

(b)

(c)

(d)

(a)

(b)

(c)

(d)

ACTIVE MATRIX SUBSTRATE AND METHOD FOR PRODUCING THE SAME

TECHNICAL FIELD

The present invention relates to an active matrix substrate formed by using an oxide semiconductor and to a method for producing the active matrix substrate.

BACKGROUND ART

An active matrix substrate used in, for example, liquid crystal display devices includes a switching element, such as a thin film transistor (hereinafter, "TFT") disposed per pixel. As such a switching element, a TFT that has an amorphous silicon film as an active layer (hereinafter, "amorphous silicon TFT") or a TFT that has a polycrystalline silicon film as an active layer (hereinafter, "polycrystalline silicon TFT") has been broadly used.

These days, it has been proposed that as a replacement for amorphous silicon or polycrystalline silicon, an oxide semiconductor be used as a material of an active layer of a TFT. Such a TFT is referred to as an "oxide semiconductor TFT". An oxide semiconductor has higher mobility than amorphous silicon. The mobility of an oxide semiconductor TFT is, for example, 20 times higher than that of an amorphous silicon TFT. Thus, it is possible for an oxide semiconductor TFT to operate more rapidly than an amorphous silicon TFT.

FIG. 12 is a graph illustrating drain current (Id)-gate voltage (Vg) characteristics of an amorphous silicon TFT, a crystalline silicon TFT, and an oxide semiconductor TFT. As shown in FIG. 12, the Id-Vg characteristics of an oxide semiconductor TFT, which has high mobility, rise sharply, which means that off-leakage current is small. The off-leakage current of an oxide semiconductor TFT is less than, for example, $\frac{1}{1000}$ of the off-leakage current of an amorphous silicon TFT and less than, for example, $\frac{1}{10000}$ of the off-leakage current of a crystalline silicon TFT. Accordingly, an oxide semiconductor TFT has excellent off-state characteristics as well as on-state characteristics.

On the other hand, techniques of disposing a driving circuit, such as a gate driver or a source driver, monolithically (in an integrated manner) on a substrate are known. Such a driving circuit (monolithic driver) typically includes a TFT. These days, a technique of producing the monolithic driver on a substrate by using an oxide semiconductor TFT is used. This achieves cost reduction by a simplified mounting process or a decrease in a picture-frame region. Typically, a TFT constituting a driving circuit (hereinafter, "circuit TFT") is simultaneously produced in a process of producing a TFT disposed per pixel (hereinafter, "pixel TFT") as a switching element. Thus, a circuit TFT and a pixel TFT are often formed by using the same oxide semiconductor film and have the same or a similar structure.

An active matrix substrate including an oxide semiconductor TFT is disclosed in, for example, PTL 1. In PTL 1, a plurality of types of oxide semiconductor TFTs having threshold voltages different from each other are formed on a single substrate by varying the elemental ratio of oxide semiconductor layers. The active matrix substrate disclosed in PTL 1 includes a plurality of types of oxide semiconductor TFTs as pixel TFTs, and these oxide semiconductor TFTs are disposed such that the threshold voltage of the pixel TFTs decreases with increasing distance from a gate-line driving circuit.

CITATION LIST

Patent Literature

PTL 1: Japanese Unexamined Patent Application Publication No. 2008-85048

SUMMARY OF INVENTION

Technical Problem

The present inventors examined and found, however, that the existing active matrix substrates described in, for example, PTL 1 have the following problems.

In an oxide semiconductor TFT, a metal element included in source and drain electrodes may disperse in an oxide semiconductor layer and cause fluctuations in the TFT characteristics. Thus, the structure disclosed in PTL 1 sometimes may fail to provide stable TFT characteristics, resulting in low reliability. Details will be described later.

When an oxide semiconductor TFT is used as a circuit TFT constituting a driving circuit (monolithic driver) as well as a pixel TFT, characteristics desired for the pixel TFT and the circuit TFT differs from each other, and thus it is desirable to form a plurality of types of oxide semiconductor TFTs having characteristics needed for various uses. According to the study of the present inventors, the threshold voltage of the circuit TFT is preferably greater than the threshold voltage of the pixel TFT, which will be described in detail later. In PTL 1, a plurality of oxide semiconductor layers having elemental ratios different from each other are each produced according to a direction (an angle) in which a material is supplied onto a substrate from a material source, which does not make characteristics of the pixel and circuit TFTs different from each other.

In view of the foregoing, embodiments of the present invention are provided, and an object thereof is to provide a highly reliable active matrix substrate including a plurality of oxide semiconductor TFTs having threshold voltages different from each other depending on use.

Solution to Problem

An active matrix substrate according to an embodiment of the present invention is an active matrix substrate having a display region including a plurality of pixels. The active matrix substrate includes a substrate, a first thin film transistor (TFT) formed on the substrate, a plurality of second TFTs that are formed on the substrate and that are disposed at each of the plurality of pixels, and at least one circuit including the first TFT. Each of the first TFT and the second TFTs includes a gate electrode, a gate insulating layer covering the gate electrode, an oxide semiconductor layer disposed to face the gate electrode with the gate insulating layer disposed therebetween, and a source electrode and a drain electrode that are in contact with an upper surface of the oxide semiconductor layer. The oxide semiconductor layer has a stacked structure formed of a plurality of semiconductor layers including a first semiconductor layer that is in contact with the source electrode and the drain electrode and that has a first energy gap and a second semiconductor layer that is disposed on a side of the first semiconductor layer near the substrate and that has a second energy gap smaller than the first energy gap. The oxide semiconductor layer of the first TFT and the oxide semiconductor layer of each of the second TFTs are different from each other in terms of a composition and/or a number of stacked layers. A threshold voltage of the first TFT is greater than a threshold voltage of each of the second TFTs.

In an embodiment, each of the source electrode and the drain electrode includes a lower layer electrode that is in contact with the first semiconductor layer and that contains no Cu and a main layer electrode that is disposed on the lower layer electrode and that contains Cu, and an edge of the lower layer electrode is formed at a position outward from an edge of the main layer electrode.

In an embodiment, each of the plurality of semiconductor layers in the oxide semiconductor layer of the first TFT has a composition different from any compositions of the plurality of semiconductor layers in each of the second TFTs.

In an embodiment, the second semiconductor layer of the first TFT is in contact with an upper surface of the gate insulating layer, and in each of the second TFTs, the oxide semiconductor layer further includes a third semiconductor layer that is disposed nearer than the second semiconductor layer to the substrate and that is in contact with the upper surface of the gate insulating layer, and an energy gap of the third semiconductor layer is larger than the second energy gap.

In an embodiment, the second semiconductor layer of each of the first TFT and the second TFTs is in contact with an upper surface of the gate insulating layer.

In an embodiment, in each of the second TFTs, the oxide semiconductor layer further includes a fourth semiconductor layer disposed between the first semiconductor layer and the second semiconductor layer, and an energy gap of the fourth semiconductor layer is smaller than the first energy gap and larger than the second energy gap.

In an embodiment, the first semiconductor layers of the first TFT and each of the second TFTs are formed of a same oxide semiconductor film, and the second semiconductor layer of the first TFT and the fourth semiconductor layer of each of the second TFTs are formed of a same oxide semiconductor film.

In an embodiment, in each of the first TFT and the second TFTs, a thickness of the first semiconductor layer is 10 nm or more and 80 nm or less, and a thickness of the second semiconductor layer is 30 nm or more and 100 nm or less.

In an embodiment, in the first TFT, a thickness of the first semiconductor layer is 10 nm or more and 80 nm or less, and a thickness of the second semiconductor layer is 30 nm or more and 100 nm or less, and in each of the second TFTs, a thickness of the first semiconductor layer is 10 nm or more and 80 nm or less, and a thickness of the second semiconductor layer is 5 nm or more and 50 nm or less.

In an embodiment, the oxide semiconductor layers of the first TFT and the second TFTs contain In, Ga, and Zn.

In an embodiment, the oxide semiconductor layer of each of the first TFT and the second TFTs includes a crystalline portion.

In an embodiment, in the oxide semiconductor layer of each of the first TFT and the second TFTs, In concentration in the first semiconductor layer is lower than In concentration in the second semiconductor layer.

In an embodiment, in the oxide semiconductor layer of each of the first TFT and the second TFTs, Ga concentration is higher than In concentration in the first semiconductor layer, and Ga concentration is lower than or equal to In concentration in the second semiconductor layer.

In an embodiment, In concentration in the second semiconductor layer of the first TFT is lower than In concentration in the second semiconductor layer of each of the second TFTs.

In an embodiment, in each of the first TFT and the second TFTs, the source electrode and the drain electrode contain Cu, and, in the oxide semiconductor layer of each of the first TFT and the second TFTs, the first semiconductor layer contains Cu, and the second semiconductor layer contains substantially no Cu.

A method for producing an active matrix substrate according to an embodiment of the present invention includes a step (a) of providing a substrate, a step (b) of forming a first gate electrode and a second gate electrode on the substrate, a step (c) of forming a gate insulating layer covering the first and second gate electrodes, a step (d) of disposing, on the gate insulating layer, a first oxide semiconductor layer at least partially overlapping the first gate electrode and disposing, on the gate insulating layer, a second oxide semiconductor layer at least partially overlapping the second gate electrode, each of the first and second oxide semiconductor layers having a stacked structure formed of a plurality of semiconductor layers including a first semiconductor layer that has a first energy gap and a second semiconductor layer that is disposed on a side of the first semiconductor layer near the substrate and that has a second energy gap smaller than the first energy gap, and a step (e) of forming a first source electrode and a first drain electrode that are disposed on the first oxide semiconductor layer so as to be separated from each other and that are each connected to the first oxide semiconductor layer and forming a second source electrode and a second drain electrode that are disposed on the second oxide semiconductor layer so as to be separated from each other and that are each connected to the second oxide semiconductor layer, thus forming, on the substrate, a first TFT including the first oxide semiconductor layer as an active layer and a second TFT including the second oxide semiconductor layer as an active layer. In the step (d), the first oxide semiconductor layer and the second oxide semiconductor layer are different from each other in terms of a composition and/or a number of stacked layers so that a threshold voltage of the first TFT is larger than a threshold voltage of the second TFT.

In an embodiment, the step (d) includes a step of forming a first oxide semiconductor film on the gate insulating layer and patterning the first oxide semiconductor film to remove a portion of the first oxide semiconductor film that is located in a region where the first TFT is to be formed and to leave a portion of the first oxide semiconductor film that is located in a region where the second TFT is to be formed, a step of forming a second oxide semiconductor film and a third oxide semiconductor film in this order on the gate insulating layer and the first oxide semiconductor film, and a step of forming the first oxide semiconductor layer from the second and third oxide semiconductor films and the second oxide semiconductor layer from the first, second, and third oxide semiconductor films by patterning the first to third oxide semiconductor films.

In an embodiment, each of the first source electrode, the first drain electrode, the second source electrode, and the second drain electrode has a stacked structure including a main layer electrode and a lower layer electrode disposed on a side of the main layer electrode near the substrate, and the step (e) includes a step of forming a lower layer electrode film containing no Cu, a step of forming a main layer electrode film containing Cu on the lower layer electrode film, a step of forming the main layer electrode by wet etching the main layer electrode film, and a step of forming the lower layer electrode by dry etching the lower layer electrode film.

In an embodiment, the first and second oxide semiconductor layers contain In, Ga, and Zn.

In an embodiment, each of the first and second oxide semiconductor layers includes a crystalline portion.

Advantageous Effects of Invention

According to an embodiment of the present invention, a highly reliable active matrix substrate including a plurality of oxide semiconductor TFTs having threshold voltages different from each other depending on use is provided.

DESCRIPTION OF EMBODIMENTS

As described above, in an oxide semiconductor TFT, a metal element or the like contained in a wiring layer (hereinafter, also referred to as an SD layer) that includes source and drain electrodes may disperse in an oxide semiconductor layer and cause fluctuations in TFT characteristics, such as threshold voltage. The study of the inventors showed that, in particular, when Cu (copper) or a Cu alloy (e.g., Cu—Ca alloy, Cu—Mg—Al alloy, or Cu—Mn alloy), which has a lower electrical resistivity than Al, was used in an SD layer, Cu was likely to disperse in the oxide semiconductor layer in a process of producing a TFT, which might lead to unstable element characteristics. For example, in an inversely staggered (bottom gate-top contact type) TFT, when Cu or a Cu alloy is used in an SD layer, Cu is likely to disperse in an oxide semiconductor layer in a source-drain separation process.

Figure 12:
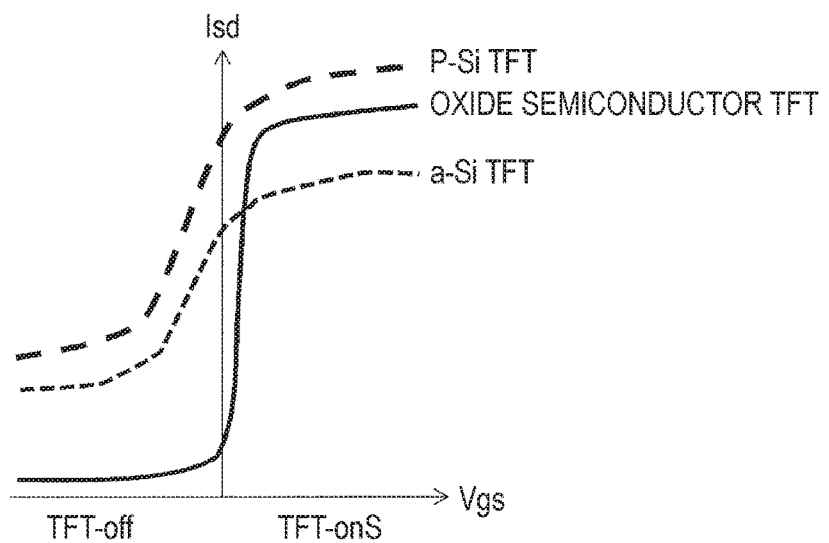
FIG. 12 illustrates current-voltage characteristics of an amorphous silicon semiconductor TFT, a polysilicon semiconductor TFT, and an oxide semiconductor TFT.

As shown in FIG. 12, an oxide semiconductor TFT has excellent off-state characteristics when a bias voltage applied to a gate is 0 V. Accordingly, charge is not released from the oxide semiconductor TFT during gate off, and electric discharge through the oxide semiconductor TFT is unlikely to occur. However, the presence of the charge that is not released and remains (residual charge) may be a major cause to shift the threshold of the oxide semiconductor TFT. Thus, the use of an oxide semiconductor TFT as a pixel TFT may cause a display defect (uneven charge distribution). To suppress this, when the oxide semiconductor TFT is used as a pixel TFT, it is preferable that the threshold voltage of the oxide semiconductor TFT be decreased to increase an off-leakage current. On the other hand, when the oxide semiconductor TFT is used as a circuit TFT, the structure is preferable in which the threshold voltage is more shifted than the threshold voltage of a pixel TFT to the positive side to reduce the off-leakage current. This is because a large off-leakage current may increase power consumption and cause poor operation of peripheral circuits, such as a driver.

Thus, the present inventors studied a structure for a novel active matrix substrate that allows formation of a plurality of types of oxide semiconductor TFTs having threshold voltages different from each other on a single substrate and that can suppress fluctuations in characteristics due to dispersion of a wiring material in an oxide semiconductor layer and achieved the present invention.

First Embodiment

Hereinafter, with reference to the drawings, a first embodiment of the semiconductor device according to the present invention will be described. The semiconductor device in the present embodiment broadly encompasses active matrix substrates, various display devices, and electronic devices. Here, an active matrix substrate will be described as an example.

Figure 1:
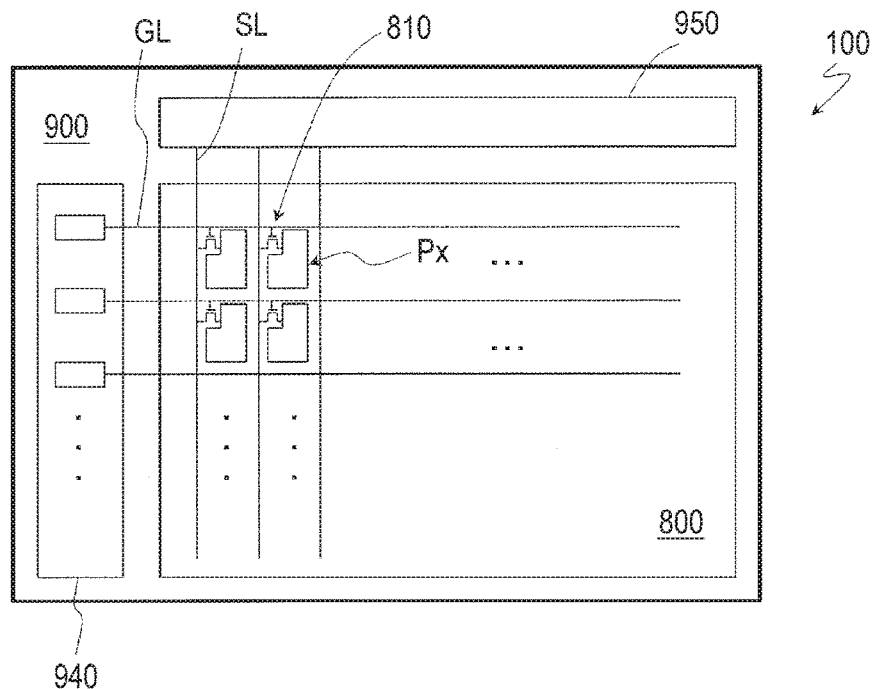
FIG. 1 is a schematic plan view of an active matrix substrate 100 in a first embodiment.
Figure 2:
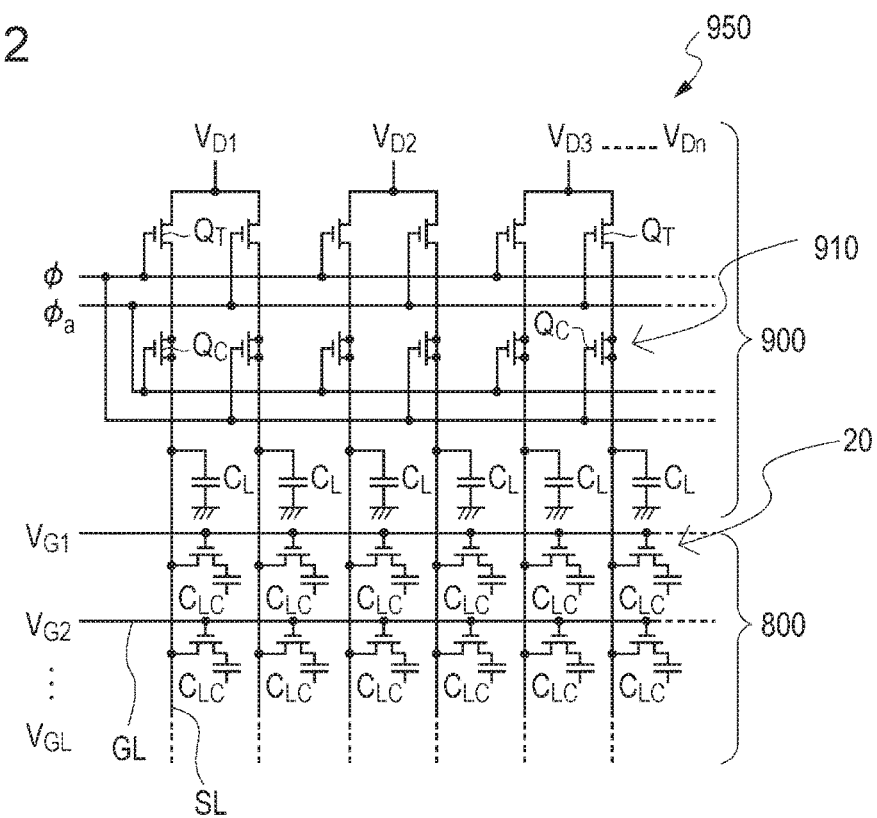
FIG. 2 is an illustration of a part of a circuit structure of the active matrix substrate 100.

FIG. 1 is a schematic plan view of an active matrix substrate 100 in the present embodiment. FIG. 2 is an illustration of a part of a circuit structure of a liquid crystal device including the active matrix substrate 100.

The active matrix substrate 100 has a display region 800 including a plurality of pixel regions Px and a region 900 (non-display region), which is a region other than the display region 800. The "pixel region Px" is a region corresponding to a pixel in a display device and may be simply referred to as "pixel" in the present Description. In the aspect shown in FIG. 1, the non-display region 900 is a strip-like region located on the upper side and left side of the display region 800; however, the non-display region 900 may be disposed in another aspect, for example, on only the lower side of the display region 800.

A plurality of gate lines GL and a plurality of source lines SL are formed in the display region 800, and each region defined by these lines is a pixel Px. The plurality of pixels Px are arranged in a matrix. In each pixel Px, a pixel TFT 810 is formed near each intersection point of the plurality of source lines SL and the plurality of gate lines GL. The pixel TFT 810 is driven by the gate lines GL that extend in a first direction (here, the horizontal direction in the plan view) and the source lines SL that extend in a second direction (here, the vertical direction in the plan view) different from the first direction. In the present embodiment, an oxide semiconductor TFT having a bottom gate structure is used as the pixel TFT 810, for example. A pixel electrode (not shown) is formed in each pixel. A drain electrode of each pixel TFT is electrically connected to the pixel electrode.

In the non-display region 900, circuits, such as a gate driver 940 and a source driver 950, a terminal portion, and the like are disposed. In the present embodiment, the gate driver 940 is a monolithic gate driver and is a circuit integrally formed on the substrate by a process of producing, for example, the pixel TFT 810. The source driver 950 may be disposed as a driver monolithically formed on the substrate in the same manner as the gate driver 940 or may be disposed by mounting an IC chip.

In the non-display region 900, a plurality of TFTs (circuit TFTs), not shown, are formed as circuit elements constituting any of the circuits. FIG. 2 illustrates the source driver 950 including circuit TFTs 910. In the present embodiment, for example, an oxide semiconductor TFT having a bottom gate structure is used as the circuit TFT 910.

The active matrix substrate 100 according to the present embodiment includes, on a single substrate, at least one first TFT, which functions as the circuit TFT 910, and a plurality of second TFTs, which function as the pixel TFTs 810. The first TFT and each of the second TFTs each include, as an active layer, an oxide semiconductor layer having a stacked structure (hereinafter, referred to as "stacked semiconductor layer" in short). The stacked semiconductor layer may have a structure in which a plurality of semiconductor layers having compositions (or composition ratios) different from each other are stacked. Incidentally, in the stacked semiconductor layer, it is only required that compositions (composition ratios) of two semiconductor layers adjacent to each other be different from each other. The stacked semiconductor layer may include a plurality of semiconductor layers having the same composition ratio. In the stacked semiconductor layer, crystal structures of two semiconductor layers adjacent to each other may be different from each other. When an SD layer contains Cu, the uppermost layer in contact with the SD layer is preferably crystalline. Cu is less likely to disperse in a crystalline oxide semiconductor than in an amorphous oxide semiconductor. Thus, forming the uppermost layer formed of a crystalline oxide semiconductor further effectively suppresses Cu dispersion in a main channel layer. Accordingly, even if an amorphous oxide semiconductor is used in a main channel layer, deterioration of reliability due to the Cu dispersion can be suppressed.

In the first and second TFTs, stacked semiconductor layers are different from each other in terms of the number of stacked layers and/or the composition. Here, the expression "the number of stacked layers" refers to the number of semiconductor layers constituting a stacked semiconductor layer. In the present embodiment, the number of stacked layers and/or the composition of the stacked semiconductor layers of the first and second TFTs is set such that the threshold voltage of the first TFT is greater than the threshold voltage of the second TFT.

Here, the expression "stacked semiconductor layers are different from each other in terms of the number of stacked layers and/or composition" means that, for example, the stacked semiconductor layer of the first TFT includes at least one semiconductor layer having a composition different from that of any of a plurality of semiconductor layers included in a stacked semiconductor layer of the second TFT, or that the stacked semiconductor layer of the second TFT 20 includes at least one semiconductor layer having a composition different from that of any of a plurality of semiconductor layers included in the stacked semiconductor layer of the first TFT 10.

The active matrix substrate 100 may further have another oxide semiconductor TFT in addition to the first and second TFTs. For example, the plurality of circuit TFTs 910 (FIG. 2) are only required to include at least one first TFT and may further include another oxide semiconductor TFT including an active layer having a monolayer structure.

Hereinafter, the structure of the active matrix substrate 100 according to the present embodiment will be described more specifically.

FIG. 3(a) is a schematic sectional view of the first TFT 10 that functions as a circuit TFT in the active matrix substrate 100. FIG. 3(b) is a schematic sectional view of the second TFT 20 that functions as a pixel TFT in the active matrix substrate 100. FIG. 4 is a schematic plan view of a single pixel Px in the active matrix substrate 100.

The active matrix substrate 100 includes a substrate 101, the first TFT 10 and the second TFT 20 that are disposed on the substrate 101, a first insulating layer (e.g., inorganic insulating layer) 107 and a second insulating layer (e.g., organic insulating layer) 108 that cover the TFTs 10 and 20, and a pixel electrode 111 electrically connected to the second TFT 20. The pixel electrode 111 is disposed on the second insulating layer 108 and connected to the second TFT 20 in a contact hole CH formed in the first and second insulating layers 107 and 108.

The first TFT 10 is a circuit TFT disposed in the non-display region. The second TFT 20 is a pixel TFT disposed at each pixel in the display region.

The first TFT 10 includes, as shown in FIG. 3(a), a gate electrode 102A supported by the substrate 101, the gate insulating layer 103 covering the gate electrode 102A, an oxide semiconductor layer 104A disposed to overlap the gate electrode 102A with the gate insulating layer 103 disposed therebetween, a source electrode 105A, and a drain electrode 106A. The first TFT 10 may be a channel-etch type TFT having a bottom gate-top contact structure. In this case, the source electrode 105A and the drain electrode 106A are disposed on the oxide semiconductor layer 104A so as to be separated from each other and to face each other. Each of the source electrode 105A and the drain electrode 106A is in contact with the upper surface of the oxide semiconductor layer 104A.

The oxide semiconductor layer 104A includes an upper semiconductor layer 104e in contact with the source and drain electrodes 105A and 106A and a lower semiconductor layer 104d disposed nearer than the upper semiconductor layer 104e to the substrate 101. In the example shown in the figure, the oxide semiconductor layer 104A has a two-layer structure, and the lower semiconductor layer 104d is in contact with the gate insulating layer 103. The oxide semiconductor layer 104A may have a stacked structure having three or more layers.

The lower semiconductor layer 104d and the upper semiconductor layer 104e have compositions (or composition ratios) different from each other. The composition of each of the layers is selected to make the energy gap of the upper semiconductor layer 104e larger than the energy gap of the lower semiconductor layer 104d. For example, in an In—Ga—Zn—O semiconductor layer, a layer having a small energy gap and high mobility can be formed by increasing the In concentration (atomic ratio) or decreasing the Ga concentration.

On the other hand, the second TFT 20 includes, as shown in FIG. 3(b), a gate electrode 102B supported by the substrate 101, the gate insulating layer 103 covering the gate electrode 102B, an oxide semiconductor layer 104B disposed to overlap the gate electrode 102B with the gate insulating layer 103 disposed therebetween, a source electrode 105B, and a drain electrode 106B. The second TFT 20 may be a channel-etch type TFT having a bottom gate-top contact structure. In this case, the source electrode 105B and the drain electrode 106B are disposed on the oxide semiconductor layer 104B so as to be separated from each other and to face each other. Each of the source electrode 105B and the drain electrode 106B is in contact with the upper surface of the oxide semiconductor layer 104B.

The oxide semiconductor layer 104B includes an upper semiconductor layer 104c in contact with the source and drain electrodes 105B and 106B, an intermediate semiconductor layer 104b disposed nearer than the upper semiconductor layer 104c to the substrate 101, and a lower semiconductor layer 104a disposed nearer than the intermediate semiconductor layer 104b to the substrate 101. In the example shown in the figure, the oxide semiconductor layer 104B has a three-layer structure, and the lower semiconductor layer 104a is in contact with the gate insulating layer 103. The oxide semiconductor layer 104B is only required to have a stacked structure in which two or more layers including at least the upper semiconductor layer 104c and another semiconductor layer disposed on the side of the upper semiconductor layer 104c near the substrate 101 are included. The oxide semiconductor layer 104B may have a stacked structure having two layers or four or more layers.

The composition (or composition ratio) of each of the lower semiconductor layer 104a, the intermediate semiconductor layer 104b, and the upper semiconductor layer 104c is selected to make the energy gap of the upper semiconductor layer 104c larger than the energy gap of the lower semiconductor layer 104a and/or the energy gap of the intermediate semiconductor layer 104b.

In this example, the source electrode 105A and the drain electrode 106A of the first TFT 10, the source electrode 105B and the drain electrode 106B of the second TFT 20, and the source lines SL are formed by using the same conductive film (stacked conductive film). The gate electrode 102A of the first TFT 10 and the gate electrode 102B of the second TFT 20 are formed by using the same conductive film. Hereinafter, the source electrodes 105A and 105B may be collectively referred to as the "source electrode 105", and the gate electrodes 102A and 102B may be collectively referred to as the "gate electrode 102".

The active matrix substrate 100 may further include a common electrode 109. Such an active matrix substrate 100 may be used in liquid crystal display devices that operate in, for example, a fringe-field switching (FFS) mode.

In the example shown in the figure, the common electrode 109 is disposed on the second insulating layer 108, for example. The common electrode 109 is covered by a third insulating layer 110. The pixel electrode 111 is disposed on the third insulating layer 110 to face the common electrode 109. The pixel electrode 111 has a plurality of linear portions (or at least one slit) and is connected to the drain electrode 106B of the second TFT 20 in the contact hole CH formed to pass through the third insulating layer 110, the second insulating layer 108, the first insulating layer 107. On the other hand, the common electrode 109 has an opening that extends to the outside region of the contact hole CH and is insulated from the pixel electrode 111 by the third insulating layer 110. With this structure, a fringe electric field can be generated between the pixel electrode 111 and the common electrode 109.

According to the present embodiment, the oxide semiconductor layer 104A of the first TFT 10 and the oxide semiconductor layer 104B of the second TFT 20 each have a stacked structure in which a plurality of semiconductor layers having energy gaps different from each other are included. Thus, the fluctuations in TFT characteristics due to the dispersion of a wiring material in the oxide semiconductor layers 104A and 104B can be suppressed. In addition, the threshold voltage of the first TFT 10 can be increased more than the threshold voltage of the second TFT 20. Therefore, it is possible to ensure reliability of the first TFT 10, which is a circuit TFT, to reduce power consumption and to suppress fluctuations in the threshold voltage of the second TFT 20, which is a pixel TFT, due to a residual charge. Hereinafter, the reason for this will be described in detail.

First, the reason why using the oxide semiconductor layers 104A and 104B (hereinafter, also collectively referred to as the "oxide semiconductor layer 104") having a stacked structure can suppress deterioration of characteristics due to dispersion of a wiring material will be described.

In channel-etch type oxide semiconductor TFTs, typically, the surface of an oxide semiconductor layer is likely to undergo etching damage in a source-drain separation process, and a carrier is likely to be trapped in a defect generated in a film. When the oxide semiconductor layer is constituted by a single layer, a carrier flows into the whole single layer, and thus the film defect has a large effect on the carrier flow. When an SD layer contains Cu, Cu may disperse in the oxide semiconductor layer in a source-drain separation process. If the layer in which Cu has dispersed is used as a channel, fluctuations in the threshold voltage occur, thereby reducing the reliability of the TFT.

On the other hand, in the oxide semiconductor layer 104 according to the present embodiment, the upper semiconductor layers 104e and 104c having a relatively large energy gap are disposed to be in contact with an SD layer, and below these, semiconductor layers having a relatively small energy gap are disposed. Thus, a carrier is caused to flow selectively into the semiconductor layers that have a smaller energy gap and higher mobility than those of the upper semiconductor layers 104e and 104c to thereby reduce the possibility of the effects of Cu and a film defect of the upper semiconductor layers 104e and 104c on the carrier flow. Here, the structure is constituted such that a carrier is caused to flow selectively into the lower semiconductor layer 104d in the oxide semiconductor layer 104A and into the intermediate semiconductor layer 104b (or the lower semiconductor layer 104a) in the oxide semiconductor layer 104B. When an SD layer contains Cu, Cu disperses selectively in the upper semiconductor layers 104e and 104c, and thus Cu dispersion in the semiconductor layers (the lower semiconductor layer 104d, the intermediate semiconductor layer 104b, and the lower semiconductor layer 104a) located below the upper semiconductor layers is effectively suppressed. Therefore, deterioration of TFT characteristics due to the Cu dispersion can be suppressed.

In the present Description, a layer (here, the upper semiconductor layer 104e or 104c) that is the uppermost layer of a stacked semiconductor layer and that is in contact with source and drain electrodes is referred to as a "buffer layer (or first semiconductor layer)". In the buffer layer, a metal element, such as Cu, contained in wiring may selectively diffuse. The thickness of the buffer layer is not particularly limited and may be 10 nm or more and 80 nm or less, for example. In a stacked semiconductor layer, a layer that is located below the buffer layer and into which a carrier selectively flows is referred to as a "main channel layer (or second semiconductor layer)". The thickness of the main channel layer is not particularly limited and may be 30 nm or more and 100 nm or less, for example. In a stacked semiconductor layer having three or more semiconductor layers, a layer having the smallest energy gap may be the main channel layer (second semiconductor layer), for example.

Figure 11:
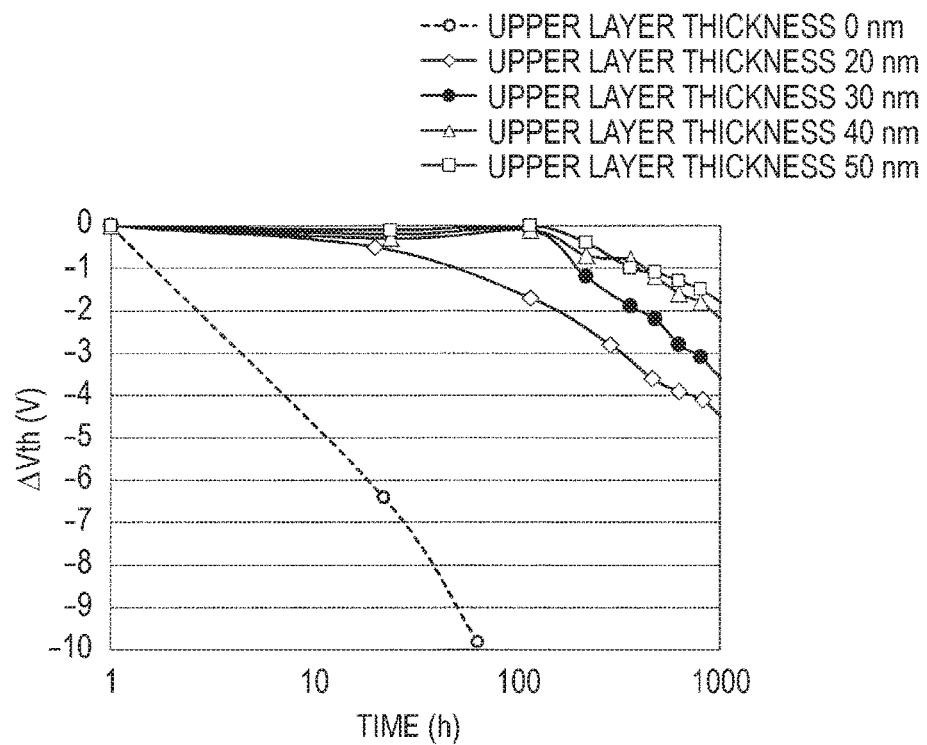
FIG. 11 illustrates a relation between thickness of an upper semiconductor layer and fluctuations in a threshold voltage $\Delta V_{th}$ of a TFT including an oxide semiconductor layer having a stacked structure.

FIG. 11 shows the results of measuring the amount of fluctuations in the threshold voltage Vth with changing the thickness of an upper semiconductor layer (buffer layer) in an oxide semiconductor layer TFT including a semiconductor layer having a two-layer structure. The thickness of a lower semiconductor layer is fixed to 60 nm. As shown in FIG. 11, when the thickness of the upper semiconductor layer is 0 nm (i.e., the upper semiconductor layer is not disposed), with increasing operation time, the threshold voltage Vth decreases considerably. In this way, when a threshold voltage Vth shifts to the negative side, an off-leakage current increases and a normally-on state is exhibited. To solve these problems, an upper semiconductor layer is disposed to thereby suppress fluctuations in the threshold voltage ΔVth. It is confirmed that when the upper semiconductor layer is thick (e.g., 40 nm or more), fluctuations in the threshold voltage ΔVth are more effectively suppressed.

The main channel layers in the oxide semiconductor layer 104 may be thicker than the buffer layers or may be thicker than any semiconductor layers constituting the oxide semiconductor layer 104.

When the oxide semiconductor layer 104 is an In—Ga—Zn—O semiconductor layer, the compositions of main channel layers (e.g., lower semiconductor layer 104d and intermediate semiconductor layer 104b) may be selected such that, for example, In concentration≥Ga concentration is satisfied. On the other hand, the compositions of the upper semiconductor layers 104e and 104c, which are used as buffer layers, may be selected such that, for example, In concentration< Ga concentration is satisfied. Each layer may be formed such that the following relation is satisfied: Ga concentration in main channel layer< Ga concentration in buffer layer (or In concentration in main channel layer> In concentration in buffer layer).

In the oxide semiconductor layer 104B, either the intermediate semiconductor layer 104b or the lower semiconductor layer 104a, whichever has a smaller energy gap, may function as a main channel layer.

The oxide semiconductor layer 104B may be constituted such that the intermediate semiconductor layer 104b is a main channel layer. In this case, the lower semiconductor layer 104a may have the same composition as that of the upper semiconductor layer 104c. The compositions of these semiconductor layers may be adjusted such that the energy gap of the lower semiconductor layer 104a is larger than the energy gap of the intermediate semiconductor layer 104b. For example, the In concentration in the intermediate semiconductor layer 104b may be higher than the In concentration in the lower semiconductor layer 104a. The lower semiconductor layer 104a is disposed to improve film properties of the main channel layer. When a semiconductor film is formed on the gate insulating layer 103, film properties may be unstable at an interface with the gate insulating layer 103 in an early stage of film forming. In this case, a semiconductor layer having an energy gap larger than that of a main channel layer (here, lower semiconductor layer 104a) is disposed on the side of the main channel layer near the gate insulating layer 103 to thereby form the main channel layer having better properties (here, intermediate semiconductor layer 104b) on the semiconductor layer. In the present Description, a semiconductor layer disposed nearer than a main channel layer to the gate insulating layer 103 to improve film properties of the main channel layer is referred to as a "film properties adjusting layer (or third semiconductor layer)".

Alternatively, the oxide semiconductor layer 104B may be constituted such that the lower semiconductor layer 104a is a main channel layer. In this case, the compositions of the semiconductor layers may be adjusted such that the energy gap of the intermediate semiconductor layer 104b is larger than that of the lower semiconductor layer 104a and smaller than that of the upper semiconductor layer 104c. For example, the In concentration in the intermediate semiconductor layer 104b may be lower than the In concentration in the lower semiconductor layer 104a and higher than the In concentration in the upper semiconductor layer 104c. In this way, an intermediate layer having an energy gap larger than that of a main channel layer is disposed between a buffer layer (upper semiconductor layer 104c) and the main channel layer (lower semiconductor layer 104a), and thus it is possible to suppress a current flowing into a back-channel side and cause the current to flow selectively into the main channel layer. In the present Description, an intermediate layer disposed between a buffer layer and a main channel layer is referred to as a "channel intermediate layer (or fourth semiconductor layer)".

When the source and drain electrodes 105 and 106 contain Cu, the upper semiconductor layers 104e and 104c, which are buffer layers, each contain Cu dispersed from the source and drain electrodes 105 and 106, and the lower semiconductor layers 104d and 104a and the intermediate semiconductor layer 104b that are located below the upper semiconductor layers may contain substantially no Cu. The Cu concentration in the main channel layer may be sufficiently lower than the Cu concentration in the buffer layer. The Cu concentration may be drastically decreased at a boundary between these layers.

Next, the control of the threshold voltages of the first TFT 10 and the second TFT 20 will be described. As described above, in the present embodiment, the structures or compositions of the oxide semiconductor layers 104A and 104B are set such that the threshold voltage of the first TFT 10 is greater than the threshold voltage of the second TFT 20. Such structures or compositions are obtained by, for example, satisfying one or more relations described below.

(1) When the oxide semiconductor layers 104A and 104B are both In—Ga—Zn—O semiconductor layers, the following is satisfied: Ga concentration in main channel layer of oxide semiconductor layer 104A> Ga concentration in main channel layer of oxide semiconductor layer 104B, or In concentration in main channel layer of oxide semiconductor layer 104A< In concentration in main channel layer of oxide semiconductor layer 104B (2) When the oxide semiconductor layers 104A and 104B are In—Zn—O semiconductor layers, the following is satisfied: In concentration in main channel layer of oxide semiconductor layer 104A< In concentration in main channel layer of oxide semiconductor layer 104B (3) Mobility (or carrier density) of main channel layer of first TFT 10< mobility (or carrier density) of main channel layer of second TFT 20

Figure 6:
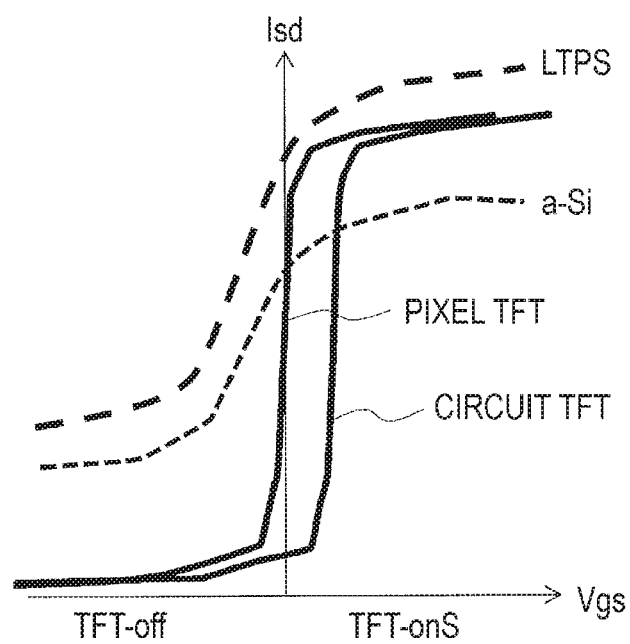
FIG. 6 illustrates exemplary current-voltage characteristics of the first TFT (circuit TFT) and the second TFT (pixel TFT).

FIG. 6 illustrates current-voltage characteristics of the first TFT 10 and the second TFT 20. As shown in the figure, the threshold voltage of the first TFT 10 is shifted more to the positive side than the threshold voltage of the second TFT 20. This suppresses power consumption of the first TFT 10 and ensures reliability. On the other hand, in the second TFT 20, when a bias voltage applied to the gate electrode 102B is 0 V (i.e., no bias), an off-leakage current can be increased more than that of the first TFT 10, thereby suppressing fluctuations in the threshold voltage due to a residual charge. When a bias voltage applied to the gate electrode 102B is 0 V (i.e., no bias), off-state characteristics are not particularly limited and may be at a level similar to, for example, those of an amorphous silicon TFT. This reduces display defects due to a residual charge.

The threshold voltage of the first TFT 10 may be, for example, 3 V or more and 5 V or less. The threshold voltage of the second TFT 20 may be, for example, 1.5 V or more and 2.5 V or less. The off-leakage current of the first TFT 10 with no bias may be $1 \times 10^{-10}$ A/μm or less. The off-leakage current of the second TFT 20 with no bias may be, for example, $1 \times 10^{-10}$ A/μm or more and $1 \times 10^{-9}$ A/μm or less. The characteristics of each of the TFTs 10 and 20 need not be as described above.

In this way, the present embodiment provides the active matrix substrate 100 including the first and second TFTs 10 and 20 whose threshold voltages are controlled depending on respective uses. The TFTs 10 and 20 have semiconductor layers having a stacked structure in which a buffer layer is included and thus may have stable desired characteristics, regardless of electrode•wiring materials. Accordingly, it is possible to use a Cu or Cu-alloy electrode, which has lower resistance, as the source and drain electrodes 105 and 106, thereby realizing a display panel with a high resolution and a narrow frame.

The first TFT 10 and the second TFT 20 may be of channel-etch type. In a channel-etch type TFT, an etch-stop layer is not formed on a channel region, and lower surfaces of ends of source and drain electrodes near the channel are disposed to be in contact with the upper surface of an oxide semiconductor layer. The channel-etch type TFT is formed by, for example, forming a conductive film for source-drain electrodes on the oxide semiconductor layer and performing source-drain separation. In the source-drain separation process, the surface of the channel region may be etched.

Compared with an etch-stop type, the channel-etch type does not need a step of disposing an etch-stop layer, thereby reducing production cost. In addition, a TFT size can be further decreased, thereby achieving a higher resolution. In the present embodiment, because the above-described stacked semiconductor layer is included as an active layer, even in a channel-etch type TFT, damage to the channel in a process of forming source and drain electrodes is suppressed, thereby achieving stable TFT characteristics.

In the present embodiment, the source electrode 105 and the drain electrode 106 may have a stacked structure. In this example, the source electrode 105 may include a main layer electrode 105b containing Cu and a lower layer electrode 105a, which is disposed under the main layer electrode 105b and is in contact with the oxide semiconductor layer 104. The drain electrode 106 may include a main layer electrode 106b containing Cu and a lower layer electrode 106a, which is disposed under the main layer electrode 106b and is in contact with the oxide semiconductor layer 104.

The main layer electrodes 105b and 106b may include, for example, Al or Cu as a main component. Here, the main layer electrodes 105b and 106b may be a Cu layer that is substantially free of impurities (a layer formed of Cu with a purity of 99.99% or more), a Cu layer containing impurities, or a Cu-alloy layer (e.g., Cu—Ca alloy layer). Forming the main layer electrodes 105b and 106b containing Cu, which is highly electrically conductive, as a main component results in reducing resistance. Accordingly, when the electrodes are used in an active matrix substrate in display devices, the decrease in visual quality due to delay and corruption of data signals can be suppressed.

On the other hand, the lower layer electrodes 105a and 106a, which are in contact with the oxide semiconductor layer 104, may be a layer that does not contain Cu. The lower layer electrodes 105a and 106a may be formed of, for example, Ti, TiN, Ti oxide, or Mo. Disposing the lower layer electrodes 105a and 106a results in reducing contact resistance between the oxide semiconductor layer 104 and the source and drain electrodes 105 and 106. The metal element such as Ti, Mo, or the like is less likely to diffuse in the oxide semiconductor layer 104 than Cu. Therefore, deterioration of TFT characteristics due to metal dispersion can be suppressed.

When viewed in the vertical direction of the substrate, the edge of the lower layer electrode 105a and the edge of the lower layer electrode 106a may be located to protrude outward from the main layer electrode 105b and the main layer electrode 106b, respectively. In other words, the main layer electrode 105b is stacked on the lower layer electrode 105a so as not to cover the peripheral portion of the lower layer electrode 105a, and the main layer electrode 106b is stacked on the lower layer electrode 106a so as not to cover the peripheral portion of the lower layer electrode 106a.

Figure 5:
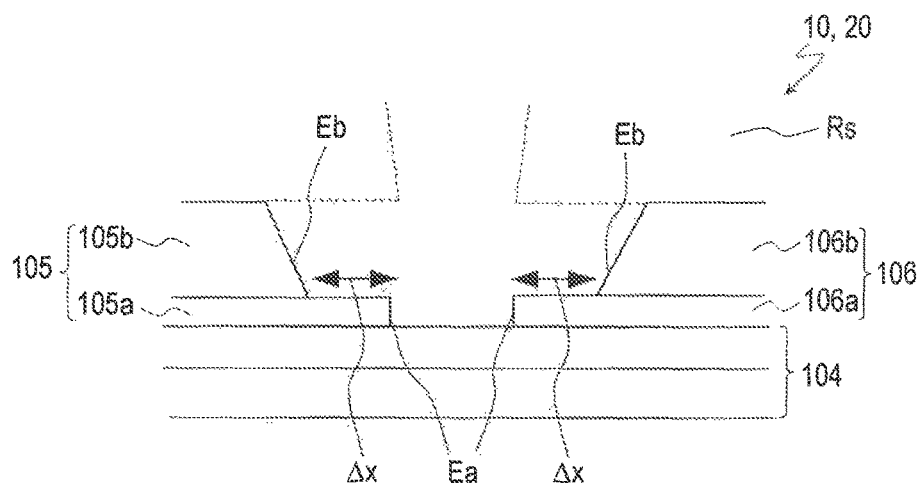
FIG. 5 is an exemplary enlarged sectional view of source and drain electrodes of the first and second TFTs.

As shown in FIG. 5, on the oxide semiconductor layer 104, an edge Ea of the lower layer electrode 105a may protrude from an edge Eb of the main layer electrode 105b in an in-plane direction by a distance Δx of 0.1 μm or more and 1.0 μm or less, and an edge Ea of the lower layer electrode 106a may protrude from an edge Eb of the main layer electrode 106b in an in-plane direction by a distance Δx of 0.1 μm or more and 1.0 μm or less. The distance Δx between the edges may be 0.2 μm or more and 0.4 μm or less. As shown in FIG. 5, the edge Eb of each of the main layer electrodes 105b and 106b may be tapered. In this case, the distance Δx between the edges may be defined as a width of a portion of the lower layer electrode 105a that protrudes without being covered with the main layer electrode 105b on a border surface between the main layer electrode 105b and the lower layer electrode 105a and a portion of the lower layer electrode 106a that protrudes without being covered with the main layer electrode 106b on a border surface between the main layer electrode 106b and the lower layer electrode 106a.

With this structure, Cu dispersion from the main layer electrodes 105b and 106b containing Cu to the oxide semiconductor layer 104 is suppressed by the protruding lower layer electrodes 105a and 106a. In particular, in a source-drain separation process, patterning the main layer electrodes 105b and 106b by wet etching followed by patterning the lower layer electrodes 105a and 106a by dry etching is performed to thereby reduce the Cu dispersion in the oxide semiconductor layer 104 in this process.

Like the above-described source and drain electrodes 105 and 106, the gate electrode 102 may have a structure in which a lower layer gate electrode 102a containing no Cu and a main layer gate electrode 102b containing Cu are stacked. If the SD layer (a layer including the source lines SL, the source electrode 105, and the drain electrode 106) and the gate layer (a layer including the gate electrode 102 and the gate lines GL) have the same structure, the advantage of simplifying a producing process is achieved.

Figure 3:
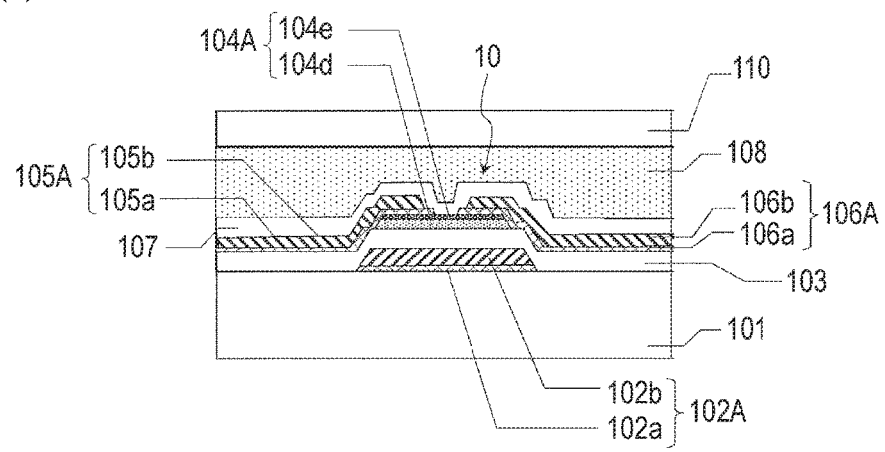
FIGS. 3(a) and 3(b) are exemplary sectional views of a first TFT 10 and a second TFT 20 in the active matrix substrate 100, respectively.
Figure 3:
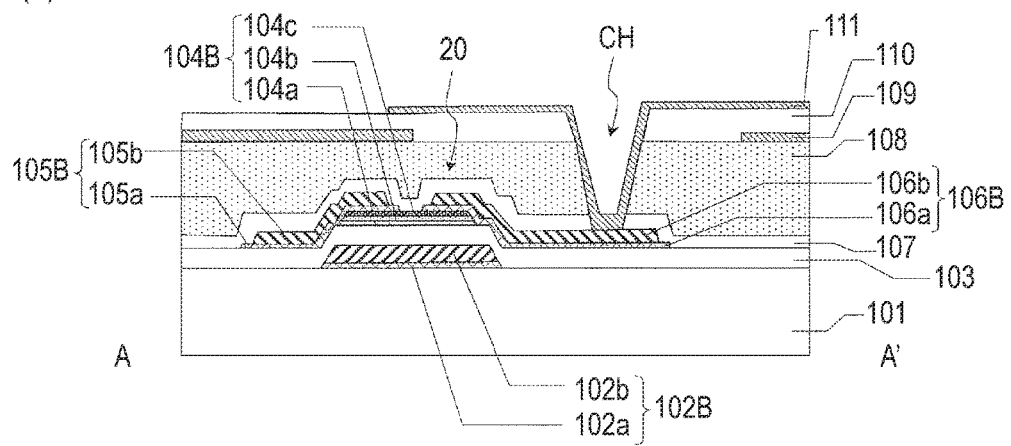
Figure 4:
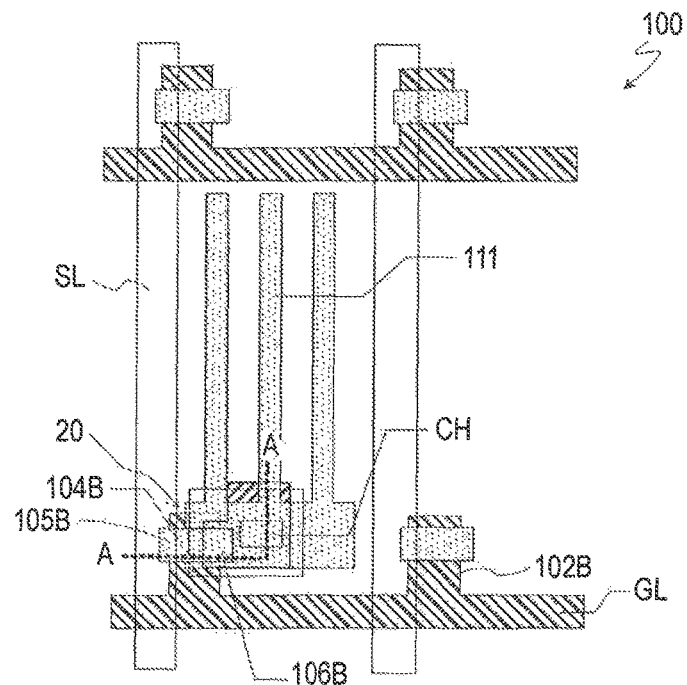
FIG. 4 is a plan view of one pixel in the active matrix substrate 100.

In examples shown in FIG. 3 and FIG. 4, the common electrode 109 is disposed nearer than the pixel electrode 111 to the substrate 101. Such an electrode structure is described in, for example, International Publication No. 2012/086513. The pixel electrode 111 may be formed on the second insulating layer 108, and the common electrode 109 may be disposed on the pixel electrode 111 with the third insulating layer 110 disposed therebetween. Such an electrode structure is described in, for example, Japanese Unexamined Patent Application Publication No. 2008-032899 and Japanese Unexamined Patent Application Publication No. 2010-008758. The contents of International Publication No. 2012/086513, Japanese Unexamined Patent Application Publication No. 2008-032899, and Japanese Unexamined Patent Application Publication No. 2010-008758 are incorporated herein by reference in their entirety.

<Oxide Semiconductor>

An oxide semiconductor included in the oxide semiconductor layers 104A and 104B may be an amorphous oxide semiconductor or a crystalline oxide semiconductor including a crystalline portion. Examples of such crystalline oxide semiconductors include polycrystalline oxide semiconductors, microcrystalline oxide semiconductors, and crystalline oxide semiconductors in which the c axis is oriented substantially perpendicularly to a layer surface.

The oxide semiconductor layers 104A and 104B are only required to have a stacked structure having two or more layers and may have a stacked structure having three or more layers. The oxide semiconductor layers 104A and 104B may include an amorphous oxide semiconductor layer and a crystalline oxide semiconductor layer. The oxide semiconductor layers 104A and 104B may include a plurality of crystalline oxide semiconductor layers having crystal structures different from each other. The oxide semiconductor layers 104A and 104B may include a plurality of amorphous oxide semiconductor layers.

Regarding an amorphous oxide semiconductor and the above-described crystalline oxide semiconductors, materials, structures, film-forming methods, a structure of an oxide semiconductor layer having a stacked structure, and the like are described in, for example, Japanese Unexamined Patent Application Publication No. 2014-007399. The contents of Japanese Unexamined Patent Application Publication No. 2014-007399 are incorporated herein by reference in its entirety.

The oxide semiconductor layers 104A and 104B may contain, for example, at least one metal element of In, Ga, and Zn. In the present embodiment, the oxide semiconductor layers 104A and 104B include, for example, an In—Ga—Zn—O semiconductor (e.g., indium-gallium-zinc oxide). Here, the In—Ga—Zn—O semiconductor is a ternary oxide of indium (In), gallium (Ga), and zinc (Zn). The ratio (composition ratio) of In, Ga, and Zn is not particularly limited and may be, for example, In:Ga:Zn=2:2:1, In:Ga:Zn=1:1:1, or In:Ga:Zn=1:1:2. Such oxide semiconductor layers 104A and 104B may be formed of an oxide semiconductor film including an In—Ga—Zn—O semiconductor.

The In—Ga—Zn—O semiconductor may be amorphous or crystalline. As a crystalline In—Ga—Zn—O semiconductor, a crystalline In—Ga—Zn—O semiconductor in which the c axis is oriented substantially perpendicularly to a layer surface is preferable.

The crystal structure of the crystalline In—Ga—Zn—O semiconductor is disclosed in, for example, the above-described Japanese Unexamined Patent Application Publication No. 2014-007399, Japanese Unexamined Patent Application Publication No. 2012-134475, and Japanese Unexamined Patent Application Publication No. 2014-209727. The contents of Japanese Unexamined Patent Application Publication No. 2012-134475 and Japanese Unexamined Patent Application Publication No. 2014-209727 are incorporated herein by reference in their entirety.

An TFT having an In—Ga—Zn—O semiconductor layer has high mobility (20 times higher than that of an a-Si TFT) and a low leakage current (less than $\frac{1}{100}$ of that of an a-Si TFT). Accordingly, the TFT is suitably used as a driving TFT (e.g., a TFT included in a driving circuit that is disposed on a substrate on which a display region is disposed and that is disposed in a periphery of the display region including a plurality of pixels) and is used as a pixel TFT (a TFT disposed in a pixel).

The oxide semiconductor layers 104A and 104B may include another oxide semiconductor instead of an In—Ga—Zn—O semiconductor, for example, an In—Sn—Zn—O semiconductor (e.g., $In_2O_3$—$SnO_2$—$ZnO$; InSn-ZnO). The In—Sn—Zn—O semiconductor is a ternary oxide of indium (In), Tin (Sn), and zinc (Zn). Alternatively, the oxide semiconductor layers 104A and 104B may include, for example, an In—Al—Zn—O semiconductor, an In—Al—Sn—Zn—O semiconductor, a Zn—O semiconductor, an In—Zn—O semiconductor, an Zn—Ti—O semiconductor, a Cd—Ge—O semiconductor, a Cd—Pb—O semiconductor, a Cd—O semiconductor, a Mg—Zn—O semiconductor, an In—Ga—Sn—O semiconductor, an In—Ga—O semiconductor, a Zr—In—Zn—O semiconductor, or a Hf—In—Zn—O semiconductor.

<Method for Producing Active Matrix Substrate 100>

Hereinafter, with reference to FIGS. 7 and 8, a process of producing the active matrix substrate 100 will be described.

Figure 7:
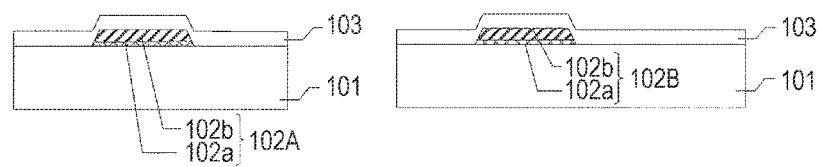
FIGS. 7(a) to 7(d) are each a process sectional view for describing a method for producing the active matrix substrate 100 in the first embodiment.
Figure 7:
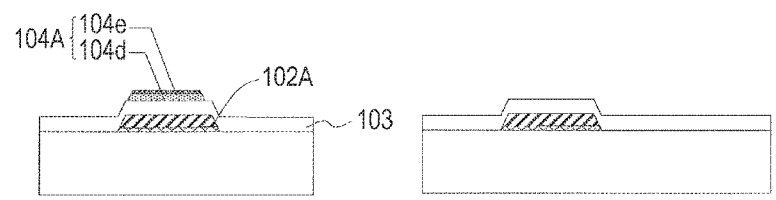
Figure 7:
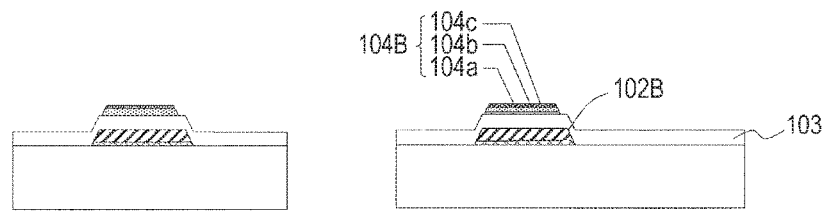
Figure 7:
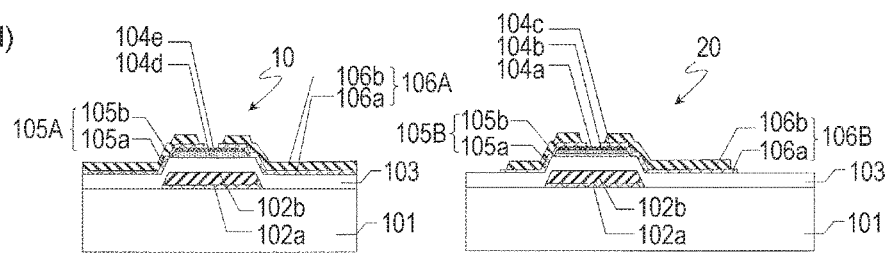
Figure 8:
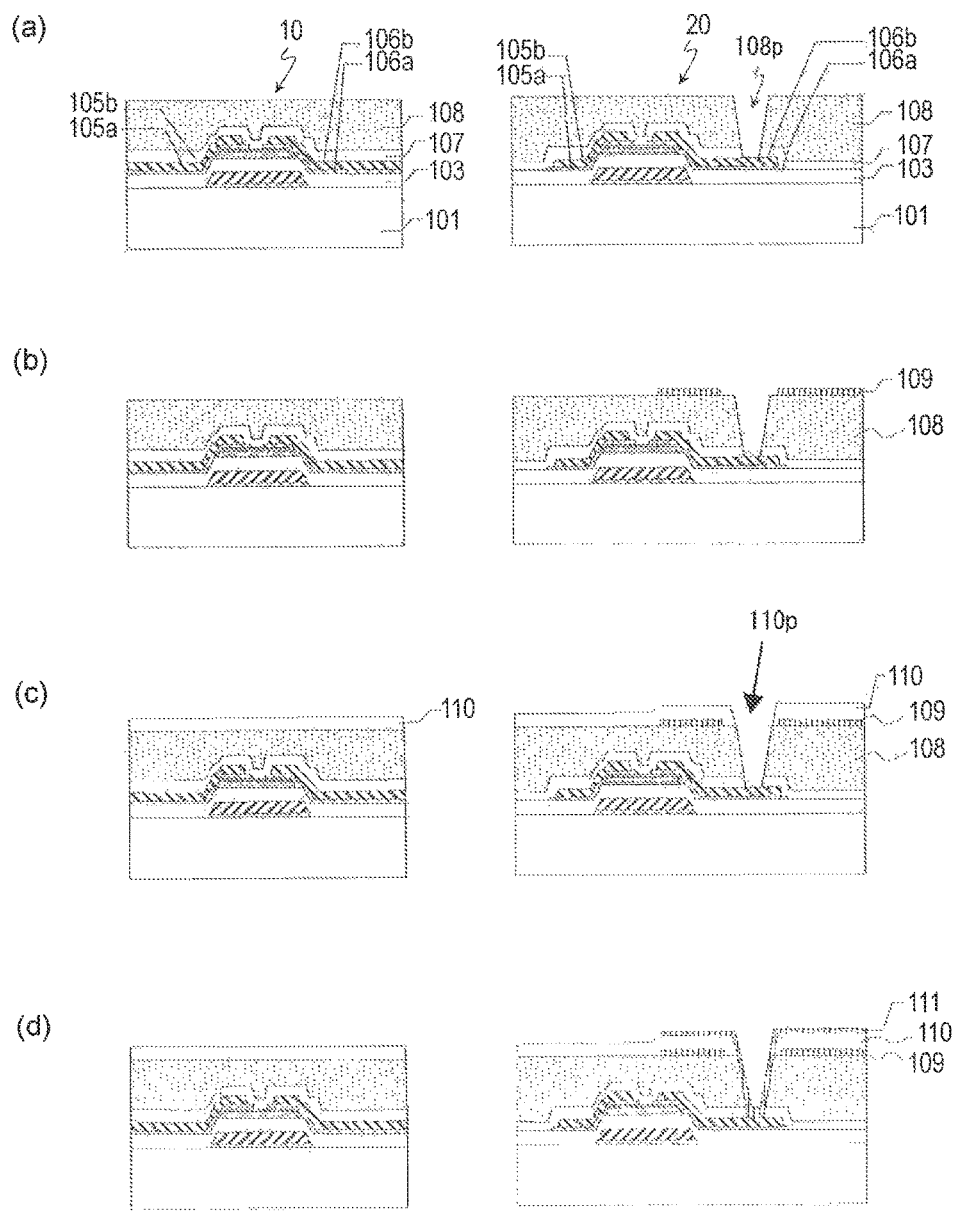
FIGS. 8(a) to 8(d) are each a process sectional view for describing the method for producing the active matrix substrate 100 in the first embodiment.

First, as shown in FIG. 7(*a*), a gate layer including the gate electrodes 102A and 102B and the gate lines GL is formed on the substrate 101. The substrate 101 may be, for example, a glass substrate, a silicon substrate, or a plastic substrate (resin substrate) having thermal resistance.

The gate layer is formed, for example, on the glass substrate 101, by depositing a metal film for a gate (thickness: e.g., 50 nm or more and 500 nm or less) by sputtering and by patterning the metal film. Patterning may be performed by photolithography, wet etching, and resist peeling.

In the present embodiment, a Cu/Ti stacked film in which a Ti film (thickness: 5 to 100 nm) and a Cu film (thickness: 100 to 500 nm) are stacked in this order is used as a metal film for a gate. A material for the metal film for a gate is not particularly limited. A metal, such as aluminum (Al), tungsten (W), molybdenum (Mo), tantalum (Ta), chromium (Cr), titanium (Ti), or copper (Cu), or an alloy thereof, or a film containing a nitride of the metal may be appropriately used.

Next, the gate insulating layer 103, which covers the gate electrode 102, and the oxide semiconductor layer 104, which is disposed to at least partially overlap the gate electrode 102 with the gate insulating layer 103 disposed therebetween and which has typically an island form, are formed.

The gate insulating layer 103 may be formed by, for example, a CVD method. The gate insulating layer 103 may appropriately be, for example, a silicon oxide ($SiO_2$) layer, a silicon nitride ($SiN_x$) layer, a silicon oxide nitride ($SiO_xN_y$; x>y) layer, or a silicon nitride oxide ($SiN_xO_y$; x>y) layer. The gate insulating layer 103 may have a stacked structure. For example, the gate insulating layer 103 may have a $SiN_x$ layer having a thickness of 200 to 500 nm near the substrate (as a lower layer) in order to prevent diffusion of impurities from the substrate 101 and may have a $SiO_2$ layer having a thickness of 25 to 100 nm on the $SiN_x$ layer.

When the uppermost layer (i.e., a layer in contact with the oxide semiconductor layer 104) of the gate insulating layer 103 is a layer containing oxygen (e.g., an oxide layer, such as $SiO_2$), if an oxygen deficiency occurs in the oxide semiconductor layer, oxygen contained in the oxide layer can compensate for the oxygen deficiency. This effectively reduces the oxygen deficiency in the oxide semiconductor layer.

Next, as shown in FIG. 7(b), the oxide semiconductor layer 104A, which is to be an active layer of the first TFT, is formed on the gate insulating layer 103. The oxide semiconductor layer 104A can be formed by sequentially depositing an oxide semiconductor film (thickness: e.g., 30 to 100 nm) for forming the lower semiconductor layer 104d and an oxide semiconductor film (thickness: e.g., 10 to 80 nm) for forming the upper semiconductor layer 104e by sputtering and by patterning the films. The oxide semiconductor films having compositions different from each other can be formed by changing target materials in sputtering. Patterning may be performed by photolithography, wet etching, and resist peeling.

Here, the lower semiconductor layer 104d is formed to be a layer having a smaller energy gap and higher mobility than those of the upper semiconductor layer 104e. Accordingly, in this example, channels are formed mainly in the lower semiconductor layer 104d (main channel layer) in the oxide semiconductor layer 104A. When the oxide semiconductor layer 104A is constituted by InGaZnO semiconductor layers, the lower semiconductor layer 104d may have a composition ratio of In:Ga:Zn=1:1:1, for example. The composition of the lower semiconductor layer 104d may be the same as the composition of an oxide semiconductor layer in an existing oxide semiconductor TFT in which the oxide semiconductor layer is constituted by a single layer, for example. In the lower semiconductor layer 104d, the In concentration (at %) may be higher than or equal to the Ga concentration (at %).

On the other hand, the upper semiconductor layer 104e is formed to have an energy gap larger than that of the lower semiconductor layer 104d and functions as a buffer layer. When the oxide semiconductor layer 104A is constituted by In—Ga—Zn—O semiconductor layers, the upper semiconductor layer 104e may have a composition in which the Ga concentration is higher than that in the lower semiconductor layer 104d or in which the In concentration is lower than that in the lower semiconductor layer 104d. In the upper semiconductor layer 104e, the In concentration may be lower than the Ga concentration.

The thickness of the upper semiconductor layer 104e may be less than that of the lower semiconductor layer 104d. Although Cu diffuses in the upper semiconductor layer 104e, even if not as thick as the lower semiconductor layer 104d, the upper semiconductor layer 104e can effectively prevent Cu dispersion in the lower semiconductor layer 104d. As described above, it is confirmed that when the upper semiconductor layer 104e is thick, fluctuations in the threshold voltage of the TFT are suppressed after aging. From this viewpoint, the upper semiconductor layer 104e preferably has a thickness of 40 nm or more.

Then, as shown in FIG. 7(c), the oxide semiconductor layer 104B, which is to be an active layer of the second TFT, is formed on the gate insulating layer 103. The oxide semiconductor layer 104B may be formed prior to the oxide semiconductor layer 104A (FIG. 7(b)) as a matter of course.

The oxide semiconductor layer 104B can be formed by sequentially depositing an oxide semiconductor film (thickness: e.g., 5 to 50 nm) for forming the lower semiconductor layer 104a, an oxide semiconductor film (thickness: e.g., 30 to 100 nm) for forming the intermediate semiconductor layer 104b, and an oxide semiconductor film (thickness: e.g., 10 to 80 nm) for forming the upper semiconductor layer 104c by sputtering and by patterning the films. The oxide semiconductor films having compositions different from each other can be formed by changing target materials in sputtering. Patterning may be performed by photolithography, wet etching, and resist peeling.

Here, the upper semiconductor layer 104c is formed to have an energy gap larger than that of the intermediate semiconductor layer 104b and functions as a buffer layer. When the oxide semiconductor layer 104B is constituted by In—Ga—Zn—O semiconductor layers, the upper semiconductor layer 104c may have a composition in which the Ga concentration is higher than that in a main channel layer (the intermediate semiconductor layer 104b or the lower semiconductor layer 104a) or in which the In concentration is lower than that in the main channel layer. The thickness of the upper semiconductor layer 104c may be less than that of the intermediate semiconductor layer 104b. Although Cu diffuses in the upper semiconductor layer 104c, even if not as thick as the intermediate semiconductor layer 104b, the upper semiconductor layer 104c can effectively prevent Cu dispersion in the intermediate semiconductor layer 104b. From the viewpoint of suppressing fluctuations in the threshold voltage of the TFT after aging, the upper semiconductor layer 104c preferably has a thickness of 40 nm or more.

The intermediate semiconductor layer 104b may be a layer that has a smaller energy gap and higher mobility than those of the upper semiconductor layer 104c and the lower semiconductor layer 104a. In this case, channels are formed mainly in the intermediate semiconductor layer 104b (main channel layer) in the oxide semiconductor layer 104B. The lower semiconductor layer 104a functions as a film properties adjusting layer. Disposing the lower semiconductor layer 104a results in forming a better main channel layer that exhibits less unstable film properties in the early stage of film forming.

Alternatively, the intermediate semiconductor layer 104b may be a layer that has an energy gap larger than that of the lower semiconductor layer 104a and smaller than that of the upper semiconductor layer 104c. In this case, the lower semiconductor layer 104a serves as a main channel layer and the intermediate semiconductor layer 104b functions as a channel intermediate layer.

The thickness of each of the intermediate semiconductor layer 104b and the lower semiconductor layer 104a is not particularly limited. The thickness of the intermediate semiconductor layer 104b may be, for example, 30 nm or more and 80 nm or less. The thickness of the lower semiconductor layer 104a may be, for example, 5 nm or more and 50 nm or less.

When the oxide semiconductor layer 104B is constituted by In—Ga—Zn—O semiconductor layers, the intermediate semiconductor layer 104b may have a composition ratio of In:Ga:Zn=1:1:1, for example. The composition of the intermediate semiconductor layer 104b may be the same as the composition of an oxide semiconductor layer in an existing oxide semiconductor TFT in which the oxide semiconductor layer is constituted by a single layer, for example. When the intermediate semiconductor layer 104b is a main channel layer, the In concentration in the intermediate semiconductor layer 104b may be adjusted to be higher than the In concentration in the lower semiconductor layer 104a. For example, in the intermediate semiconductor layer 104b, the In concentration (at %) may be higher than or equal to the Ga concentration (at %). On the other hand, when the intermediate semiconductor layer 104b is used as a channel intermediate layer, the In concentration in the intermediate semiconductor layer 104b may be adjusted to be lower than the In concentration in the lower semiconductor layer 104a.

In addition, in the steps shown in FIGS. 7(b) and 7(c), the composition and thickness of each semiconductor layer in the oxide semiconductor layers 104A and 104B are set such that the threshold voltage of the first TFT is greater than the threshold voltage of the second TFT and, for example, may be set such that at least one of the above-described (1) to (3) is satisfied.

Here, the energy gap of the intermediate semiconductor layer 104b is adjusted to be larger than that of the lower semiconductor layer 104a and smaller than that of the upper semiconductor layer 104c to make the lower semiconductor layer 104a function as a main channel layer. When an In—Ga—Zn—O semiconductor is used, the composition ratio and thickness of each semiconductor layer may be adjusted as follows, for example.

Lower semiconductor layer 104a (main channel layer of the second TFT) In concentration is higher than that in a semiconductor in which In:Ga:Zn=1:1:1. (thickness) 5 to 50 nm.

Intermediate semiconductor layer 104b In:Ga:Zn=1:1:1, (thickness) 30 to 80 nm

Upper semiconductor layer 104c In concentration is lower than that in a semiconductor in which In:Ga:Zn=1:1:1. (thickness) 30 to 70 nm Lower semiconductor layer 104d (main channel layer of the first TFT) In:Ga:Zn=1:1:1, (thickness) 30 to 80 nm Upper semiconductor layer 104e In concentration is lower than that in a semiconductor in which In:Ga:Zn=1:1:1. (thickness) 30 to 80 nm.

Subsequently, an SD layer including the source electrode 105A and drain electrode 106A of the first TFT, the source electrode 105B and drain electrode 106B of the second TFT, and the source lines SL is formed by forming a metal film for SD and patterning the film. This provides the first TFT 10 and the second TFT 20.

In this example, a stacked film is formed as a metal film for SD, and source and drain electrodes each having a stacked structure are formed. First, a lower layer electrode film (here, Ti film) having a thickness of 5 to 100 nm is deposited, and subsequently a main layer electrode film (here, Cu film) having a thickness of 100 to 500 nm is deposited by sputtering. Next, resists are disposed on the formed Cu/Ti film by photolithography. In FIG. 5, resists Rs for forming the source electrode 105 and the drain electrode 106 are shown.

With the resists Rs being disposed, first, the Cu film on the upper side is wet-etched to form the main layer electrodes 105b and 106b. An etching liquid may be an etchant including hydrogen peroxide ($H_2O_2$), for example. Here, wet etching is isotropic etching, and thus a portion of the Cu film covered by the resists Rs is also etched (side-etched), for example, in a direction from the end to an inside of the resists by a distance $\Delta x$ of 0.1 µm to 1.0 µm. The amount of side etching can be controlled by adjusting etching time. When a sufficient selection ratio is ensured, the amount of side etching can be easily increased by increasing the etching time.

Next, the Ti film, which is a lower layer, is dry-etched to form the lower layer electrodes 105a and 106a. Here, dry etching is anisotropic etching, and thus etching proceeds in a thickness direction mostly without proceeding in a region covered by the resists Rs. As a result, the edge Ea of the lower layer electrode is formed outside of the edge Eb of the main layer electrode, which inwardly recessed under the resists.

Then, a resist peeling step and a washing step are performed. This provides the source electrode 105 having a structure in which the edge of the lower layer electrode 105a that protrudes outward from the edge of the main layer electrode 105b, for example, by 0.1 to 1.0 µm and the drain electrode 106 having a structure in which the edge of the lower layer electrode 106a that protrudes outward from the edge of the main layer electrode 106b, for example, by 0.1 to 1.0 µm, as shown in FIG. 7(d).

As described above, a portion of the oxide semiconductor layer is exposed in source-drain separation; however, in the present embodiment, even if an oxygen deficiency or the like occurs in the upper semiconductor layers 104c and 104e, another semiconductor layer located thereunder can be used as a channel, thereby suppressing an increase in an off-current and preventing the threshold voltage from being negative (depression characteristics).

The Cu content of the main layer electrodes 105b and 106b may be, for example, 90 at % or more and is preferably 95 at % and more. More preferably, the main layer electrodes 105b and 106b are pure Cu layers (Cu content: e.g., 99.99% or more). The thickness of the main layer electrodes 105b and 106b may be, for example, 100 nm or more and 500 nm or less. When the thickness is 100 nm or more, electrodes and lines that have low resistance can be formed. If the thickness is more than 500 nm, fracture of the protective layer disposed on the main layer electrodes is likely to occur.

The thickness of the lower layer electrodes 105a and 106a is preferably less than the thickness of the main layer electrodes 105b and 106b. This decreases on-resistance. The thickness of the lower layer electrode may be, for example, 5 nm or more and 100 nm or less. When the thickness is 5 nm or more, the contact resistance between the oxide semiconductor layer 104 and the source and drain electrodes 105 and 106 is effectively reduced. In addition, Cu dispersion in the oxide semiconductor layer 104 is more reliably suppressed. When the thickness is 100 nm or less, the total thickness of a metal film for source lines can be kept small, while the advantage of reducing the contact resistance can be obtained.

The material and thickness of the metal film for SD is not limited to the above, and the same material as the material of the above-described metal film for a gate may be used. The metal film for SD may be a stacked film having three or more layers or does not necessarily have a stacked structure.

Next, as shown in FIG. 8(a), the inorganic insulating layer 107 and the second insulating layer 108 that cover the first TFT 10 and the second TFT 20 are disposed. The first insulating layer 107 may be a protective layer (passivation film) and typically an inorganic insulating layer. The first insulating layer 107 can be obtained by, for example, forming a $SiO_2$ film having a thickness of 100 to 400 nm and forming a $SiN_x$ film having a thickness of 20 to 200 nm on the $SiO_2$ film by a CVD method. The second insulating layer 108 may be a planarization layer. The second insulating layer 108 can be obtained, for example, by applying an organic insulating film (e.g., UV curing resin) having a thickness of 1 to 3 µm. Next, an opening 108p through which a portion of the drain electrode 106B is exposed is disposed in each of the inorganic insulating layer 107 and the second insulating layer 108.

Then, as shown in FIG. 8(b), the common electrode 109 is formed on the second insulating layer 108. The common electrode 109 can be obtained by, for example, depositing an ITO film to 50 to 200 nm by sputtering and then patterning the film by photolithography, wet etching, and resist peeling. In this example, the common electrode 109 has an opening that extends to an outer region of the opening 108p.

Next, as shown in FIG. 8(c), the third insulating layer 110 is formed to cover the common electrode 109. The third insulating layer 110 can be obtained by forming a $SiO_2$ film having a thickness of 100 to 400 nm by a CVD method, performing patterning by photolithography, and then forming an opening 110p by dry etching. The opening 110p and the opening 108p are disposed to at least partially overlap with each other. In this way, a contact hole CH is provided.

In the above-described step in FIG. 8(a), the contact hole CH through which the drain electrode 106B is exposed may be formed by providing an opening only in the second insulating layer 108 and, in an etching step of forming the opening 110p in the third insulating layer 110, by etching the first insulating layer 107 simultaneously.

Then, as shown in FIG. 8(d), the pixel electrode 111 is formed. The pixel electrode 111 can be obtained by depositing an ITO film to 50 to 200 nm by sputtering and then patterning the film by photolithography, wet etching, and resist peeling. The pixel electrode 111 is formed to be connected to the drain electrode 106B of the second TFT 20 in the contact hole CH. The pixel electrode 111 may have a planar form including a plurality of linear portions (or at least one slit); however, the pixel electrode 111 is not limited thereto and may have a form that extends to a whole rectangular region surrounded by the source lines SL and the gate lines GL, when used in a liquid crystal display device that operates in a vertical alignment (VA) mode.

According to the above steps, the active matrix substrate 100 including the first TFT 10 and the second TFT 20 can be produced.

Second Embodiment

Hereinafter, a second embodiment of the semiconductor device according to the present invention will be described. The semiconductor device of the present embodiment is different from that of the first embodiment in that each of the oxide semiconductor layer 104A of the first TFT 10 and the oxide semiconductor layer 104B of the second TFT 20 has a two-layer structure. Elements the same as those in the first embodiment will be denoted by like reference signs, and detailed descriptions of such elements may be omitted.

FIGS. 9(a) to 9(d) are exemplary process sectional views of a method for producing first and second TFTs in an active matrix substrate according to the present embodiment.

Figure 9:
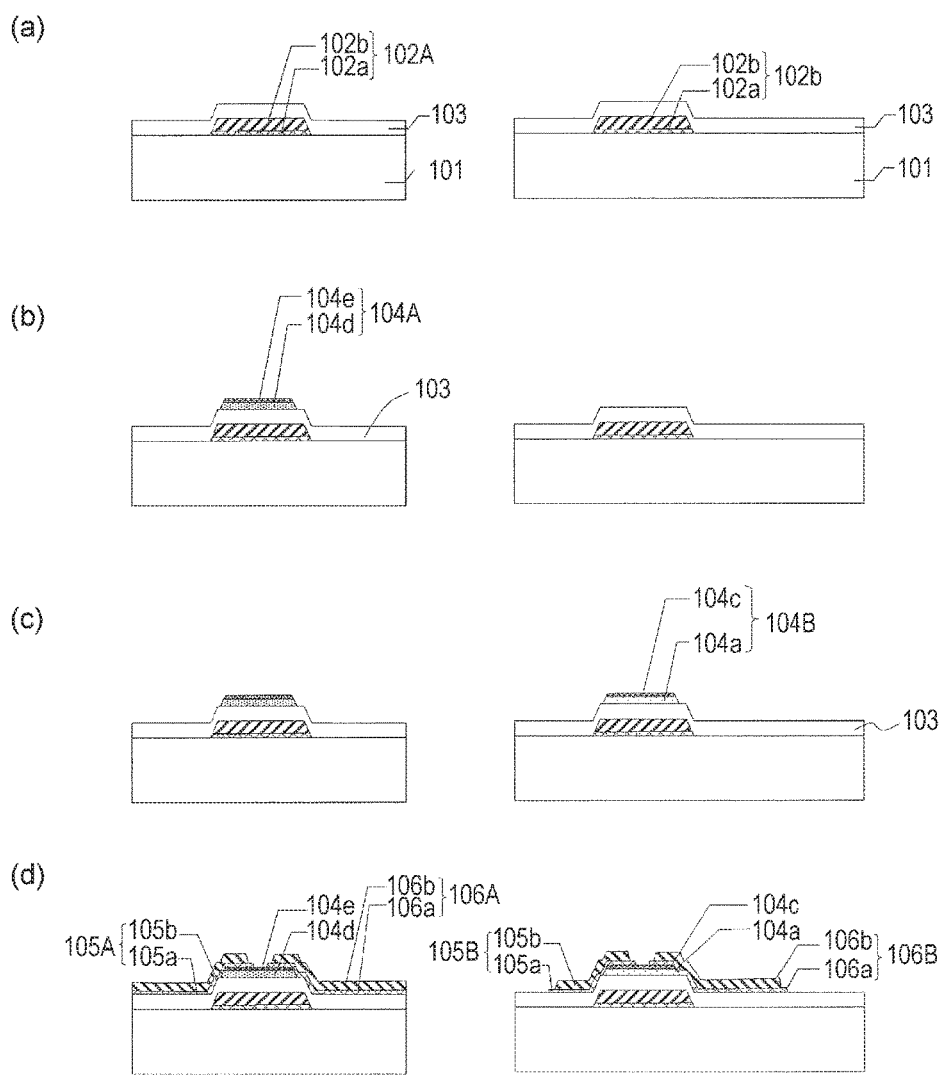
FIGS. 9(a) to 9(d) are each a process sectional view for describing a method for producing an active matrix substrate in a second embodiment.

As shown in FIG. 9(a), the gate electrodes 102A and 102B and the gate insulating layer 103 are formed on the substrate 101. The material, thickness, and forming method of each layer are the same as those described in the first embodiment with reference to FIG. 7(a).

Then, as shown in FIG. 9(b), the oxide semiconductor layer 104A of the first TFT is formed. The material, thickness, and forming method of each layer of the oxide semiconductor layer 104A are the same as those described in the first embodiment with reference to FIG. 7(b).

Then, on the gate insulating layer 103, the oxide semiconductor layer 104B, which is to be an active layer of the second TFT, is formed. Here, the oxide semiconductor layer 104B having a two-layer structure including the lower semiconductor layer 104a and the upper semiconductor layer 104c is obtained.

First, an oxide semiconductor film (thickness: e.g., 5 to 50 nm) for forming the lower semiconductor layer 104a and an oxide semiconductor film (thickness: e.g., 10 to 80 nm) for forming the upper semiconductor layer 104c are sequentially deposited by sputtering, and the films are patterned. The film-forming method and the patterning method may be the same as those described in the first embodiment.

The upper semiconductor layer 104c is formed as a layer having an energy gap larger than that of the lower semiconductor layer 104a and functions as a buffer layer. The material and composition of the upper semiconductor layer 104c may be the same as those in the first embodiment.

The lower semiconductor layer 104a is formed as a layer that has a smaller energy gap and higher mobility than those of the upper semiconductor layer 104c. In this example, channels are formed mainly in the lower semiconductor layer 104a in the oxide semiconductor layer 104A. In the example shown in the figure, the lower semiconductor layer 104a is thicker than the upper semiconductor layer 104c and may be thinner than the upper semiconductor layer 104c.

When the oxide semiconductor layer 104B is constituted by InGaZnO semiconductor layers, the lower semiconductor layer 104a may have a composition ratio of, for example, In:Ga:Zn=1:1:1. The composition of the lower semiconductor layer 104a may be the same as the composition of an oxide semiconductor layer in an existing oxide semiconductor TFT in which the oxide semiconductor layer is constituted by a single layer, for example. In the lower semiconductor layer 104a, the In concentration (at %) may be higher than or equal to the Ga concentration (at %). On the other hand, the upper semiconductor layer 104c may have a composition in which the Ga concentration is higher than that in the lower semiconductor layer 104a or in which the In concentration is lower than that in the lower semiconductor layer 104a. In the upper semiconductor layer 104c, the In concentration may be lower than the Ga concentration.

As shown in the figure, the thickness of the upper semiconductor layer 104c may be less than the thickness of the lower semiconductor layer 104a. Even if thinner than the lower semiconductor layer 104a, the upper semiconductor layer 104c can effectively prevent Cu dispersion in the lower semiconductor layer 104a. From the viewpoint of suppressing fluctuations in the threshold voltage of the TFT after aging, the upper semiconductor layer 104c preferably has a thickness of 40 nm or more.

In addition, the composition and thickness of each semiconductor layer are set such that the threshold voltage of the first TFT is greater than the threshold voltage of the second TFT and, for example, may be set such that at least one of the above-described (1) to (3) is satisfied. For one example, the main channel layer of the first TFT may be an In—Ga—Zn—O semiconductor and the main channel layer of the second TFT may be an In—Sn—Zn—O semiconductor. This makes the mobility (carrier density) of the main channel layer of the first TFT 10 less than the mobility (carrier density) of the main channel layer of the second TFT 20, so that the threshold voltage of the first TFT 10 can be greater than the threshold voltage of the second TFT 20. In this case, the composition ratio and thickness of each semiconductor layer are adjusted as follows, for example.

Lower semiconductor layer 104a (main channel layer of the second TFT) In:Sn:Zn=1:1:1, (thickness) 10 to 50 nm Upper semiconductor layer 104c In concentration is lower than that in a semiconductor in which In:Ga:Zn=1:1:1. (thickness) 40 to 80 nm.

Lower semiconductor layer 104d (main channel layer of the first TFT) In:Ga:Zn=1:1:1, (thickness) 30 to 80 nm Upper semiconductor layer 104e In concentration is lower than that in a semiconductor in which In:Ga:Zn=1:1:1. (thickness) 40 to 80 nm.

Subsequently, as shown in FIG. 9(d), an SD layer including the source electrodes 105A and 105B and the drain electrodes 106A and 106B is formed. This provides the first TFT 10 and the second TFT 20. The material, thickness, and forming method of the SD layer are the same as those in the first embodiment. After this, the first insulating layer 107, the second insulating layer 108, the common electrode 109, the third insulating layer 110, and the pixel electrode 111 are formed to obtain an active matrix substrate in the same manner as in the first embodiment, which are not shown.

Third Embodiment

Hereinafter, a third embodiment of the semiconductor device according to the present invention will be described.

An active matrix substrate according to the present embodiment is different from the active matrix substrate 100 of the first embodiment in that the lower semiconductor layer 104d of the first TFT 10 and the intermediate semiconductor layer 104b of the second TFT 20 are formed of the same oxide semiconductor film and that the upper semiconductor layer 104e of the first TFT 10 and the upper semiconductor layer 104c of the second TFT 20 are formed of the same oxide semiconductor film. In other words, in the present embodiment, the oxide semiconductor layer 104B of the second TFT 20 includes the same stacked semiconductor layer as that of the oxide semiconductor layer 104A and has further the lower semiconductor layer 104a below the stacked semiconductor layer.

In the present embodiment, in the first TFT 10, the upper semiconductor layer 104e functions as a buffer layer, and the lower semiconductor layer 104d functions as a main channel layer. In the second TFT 20, the upper semiconductor layer 104c functions as a buffer layer, the intermediate semiconductor layer 104b functions as a channel intermediate layer, and the lower semiconductor layer 104a functions as a main channel layer. For example, a semiconductor layer in which the In concentration is higher (or channel density is higher) than those in the semiconductor layers 104b, 104c, 104d, and 104e is formed as the lower semiconductor layer 104a. This allows the lower semiconductor layer 104a to function as the main channel layer of the second TFT 20 and enables the threshold voltage of the second TFT 20 to be less than the threshold voltage of the first TFT 10.

In the present embodiment, it is only required that any one layer of the oxide semiconductor layer 104A of the first TFT 10 and any one layer of the oxide semiconductor layer 104B of the second TFT 20 are formed by using the same oxide semiconductor film. For example, only the upper semiconductor layers 104e and 104c, each functioning as a buffer layer, may be formed by using the same oxide semiconductor film, and the lower semiconductor layer 104d and the intermediate semiconductor layer 104b may be formed of oxide semiconductor films different from each other.

FIGS. 10(a) to 10(d) are exemplary process sectional views of a method for producing the first and second TFTs in the active matrix substrate according to the present embodiment.

Figure 10:
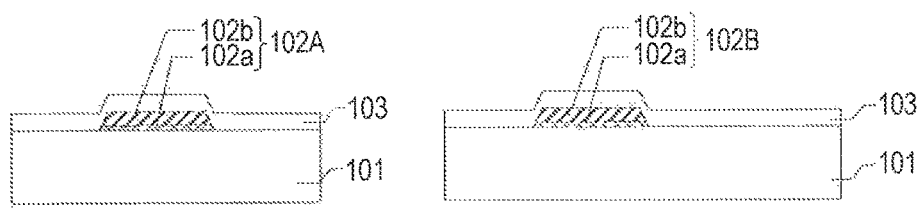
FIGS. 10(a) to 10(d) are each a process sectional view for describing a method for producing an active matrix substrate in a third embodiment.
Figure 10:
Figure 10:
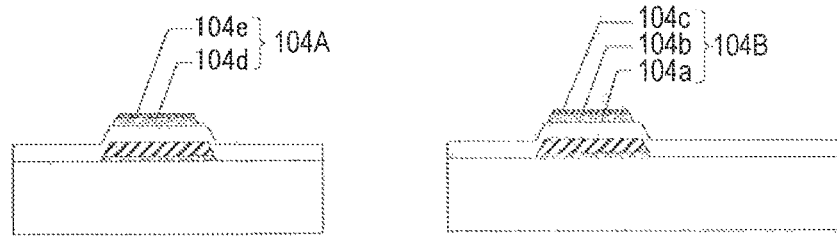
Figure 10:
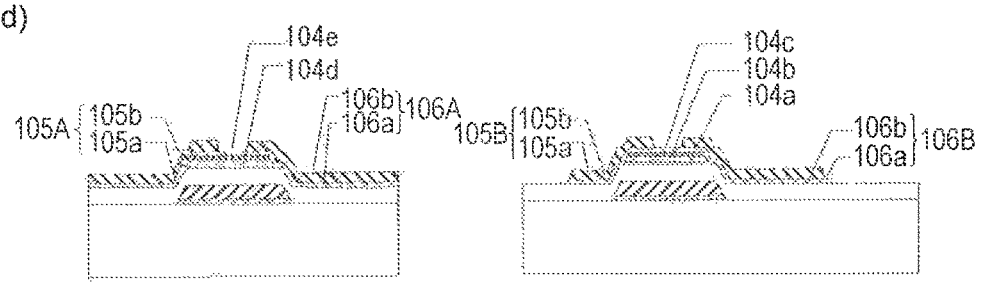

As shown in FIG. 10(a), the gate electrodes 102A and 102B and the gate insulating layer 103 are formed on the substrate 101. The material, thickness, and forming method of each layer are the same as those described in the first embodiment with reference to FIG. 7(a).

Then, as shown in FIG. 10(b), a first oxide semiconductor film 104a' for forming the lower semiconductor layer 104a of the second TFT is formed in a whole region where pixel TFTs are to be disposed (here, a whole display region) on the gate insulating layer 103.

Then, on the gate insulating layer 103 and the first oxide semiconductor film 104a', a second oxide semiconductor film (not shown) for forming the lower semiconductor layer 104d and the intermediate semiconductor layer 104b and a third oxide semiconductor film (not shown) for forming the upper semiconductor layer 104e and the upper semiconductor layer 104c are formed in this order. Subsequently, the first to third oxide semiconductor films are patterned simultaneously to thereby obtain the oxide semiconductor layer 104A including the lower semiconductor layer 104d and the upper semiconductor layer 104e and the oxide semiconductor layer 104B including the lower semiconductor layer 104a, the intermediate semiconductor layer 104b, and the upper semiconductor layer 104c.

The material, thickness, and the like of each layer of the oxide semiconductor layer 104A may be the same as those in the first embodiment. In other words, the composition and thickness of the upper semiconductor layer 104e of the oxide semiconductor layer 104A and the upper semiconductor layer 104c of the oxide semiconductor layers 104B may be the same as those of the upper semiconductor layer 104e of the oxide semiconductor layer 104A described in the first embodiment with reference to FIG. 7(b). The composition and thickness of the lower semiconductor layer 104d of the oxide semiconductor layer 104A and the intermediate semiconductor layer 104b of the oxide semiconductor layer 104B may be the same as those of the lower semiconductor layer 104d of the oxide semiconductor layer 104A described in the first embodiment with reference to FIG. 7(b).

On the other hand, the composition and thickness of the lower semiconductor layer 104a of the oxide semiconductor layer 104B are set such that the threshold voltage of the first TFT is greater than the threshold voltage of the second TFT. For example, the lower semiconductor layer 104a may be an In—Ga—Zn—O semiconductor layer, and its composition may be adjusted such that the In concentration is lower than that in a semiconductor in which In:Ga:Zn=1:1:1. Alternatively, the lower semiconductor layer 104a may be an In—Sn—Zn—O semiconductor layer. The thickness of the lower semiconductor layer 104a may be, for example, 5 nm or more and 50 nm or less. The thickness of the lower semiconductor layer 104a, which is a main channel layer, may be less than the thickness of the intermediate semiconductor layer 104b. This enables more precise control of the threshold voltage of the second TFT.

Subsequently, as shown in FIG. 10(d), an SD layer including the source electrodes 105A and 105B and the drain electrodes 106A and 106B is formed. This provides the first TFT 10 and the second TFT 20. The material, thickness, and forming method of the SD layer are the same as those in the first embodiment. After this, the first insulating layer 107, the second insulating layer 108, the common electrode 109, the third insulating layer 110, and the pixel electrode 111 are formed to obtain an active matrix substrate in the same manner as in the first embodiment, which are not shown.

While the embodiments of the present invention have been described above, the present invention may include other various aspects. In the above embodiments, the first TFTs 10, each of which is a circuit TFT, are disposed in a non-display region, and the second TFTs 20, each of which is a pixel TFT, are disposed in a display region; however, for example, when a gate driver circuit is disposed in each of a plurality of pixels, the first TFTs 10 may be partly or totally disposed in the display region (in pixels) (for example, refer to International Publication No. 2014/069529 filed by the present applicant). International Publication No. 2014/069529 is incorporated herein by reference.

INDUSTRIAL APPLICABILITY

The embodiments of the present invention may be broadly applied to oxide semiconductor TFTs and various semiconductor devices having oxide semiconductor TFTs, for example, to circuit substrates, such as active matrix substrates; display devices, such as liquid crystal display devices, organic electroluminescent (EL) display devices, and inorganic electroluminescent display devices; imaging devices, such as image sensor devices; and various electronic devices, such as image input devices, fingerprint reading devices, and semiconductor memories.

REFERENCE SIGNS LIST 10 first TFT (circuit TFT)
20 second TFT (pixel TFT)
100 active matrix substrate
101 substrate
102A, 102B gate electrode
103 gate insulating layer
104A, 104B oxide semiconductor layer
104a lower semiconductor layer
104b intermediate semiconductor layer
104c upper semiconductor layer
104d lower semiconductor layer
104e upper semiconductor layer
105A, 105B source electrode
105a lower layer electrode
105b main layer electrode
106A, 106B drain electrode
106a lower layer electrode
106b main layer electrode
107 first insulating layer
108 second insulating layer
109 common electrode
110 third insulating layer
111 pixel electrode

The invention claimed is:

1. An active matrix substrate having a display region including a plurality of pixels, the active matrix substrate comprising:
   a substrate;
   a first thin film transistor (TFT) formed on the substrate;
   a plurality of second TFTs that are formed on the substrate and that are disposed at each of the plurality of pixels; and
   at least one circuit including the first TFT,
   wherein each of the first TFT and the second TFTs includes a gate electrode, a gate insulating layer covering the gate electrode, an oxide semiconductor layer disposed to face the gate electrode with the gate insulating layer disposed therebetween, and a source electrode and a drain electrode that are in contact with an upper surface of the oxide semiconductor layer,
   the oxide semiconductor layer has a stacked structure formed of a plurality of semiconductor layers including a first semiconductor layer that is in contact with the source electrode and the drain electrode and that has a first energy gap and a second semiconductor layer that is disposed on a side of the first semiconductor layer near the substrate and that has a second energy gap smaller than the first energy gap,
   the oxide semiconductor layer of the first TFT and the oxide semiconductor layer of each of the second TFTs are different from each other in terms of a composition and/or a number of stacked layers, and
   a threshold voltage of the first TFT is greater than a threshold voltage of each of the second TFTs.

2. The active matrix substrate according to claim 1, wherein
   each of the source electrode and the drain electrode includes a lower layer electrode that is in contact with the first semiconductor layer and that contains no Cu and a main layer electrode that is disposed on the lower layer electrode and that contains Cu, and
   an edge of the lower layer electrode is formed at a position outward from an edge of the main layer electrode.

3. The active matrix substrate according to claim 1, wherein each of the plurality of semiconductor layers in the oxide semiconductor layer of the first TFT has a composition different from any compositions of the plurality of semiconductor layers in each of the second TFTs.

4. The active matrix substrate according to claim 1, wherein
   the second semiconductor layer of the first TFT is in contact with an upper surface of the gate insulating layer, and
   in each of the second TFTs, the oxide semiconductor layer further includes a third semiconductor layer that is disposed nearer than the second semiconductor layer to the substrate and that is in contact with the upper surface of the gate insulating layer, and an energy gap of the third semiconductor layer is larger than the second energy gap.

5. The active matrix substrate according to claim 1, wherein the second semiconductor layer of each of the first TFT and the second TFTs is in contact with an upper surface of the gate insulating layer.

6. The active matrix substrate according to claim 5, wherein, in each of the second TFTs, the oxide semiconductor layer further includes a fourth semiconductor layer disposed between the first semiconductor layer and the second semiconductor layer, and an energy gap of the fourth semiconductor layer is smaller than the first energy gap and larger than the second energy gap.

7. The active matrix substrate according to claim 6, wherein
   the first semiconductor layers of the first TFT and each of the second TFTs are formed of a same oxide semiconductor film, and
   the second semiconductor layer of the first TFT and the fourth semiconductor layer of each of the second TFTs are formed of a same oxide semiconductor film.

8. The active matrix substrate according to claim 4, wherein, in each of the first TFT and the second TFTs, a thickness of the first semiconductor layer is 10 nm or more and 80 nm or less, and a thickness of the second semiconductor layer is 30 nm or more and 100 nm or less.

9. The active matrix substrate according to claim 5, wherein,
   in the first TFT, a thickness of the first semiconductor layer is 10 nm or more and 80 nm or less, and a thickness of the second semiconductor layer is 30 nm or more and 100 nm or less, and
   in each of the second TFTs, a thickness of the first semiconductor layer is 10 nm or more and 80 nm or less, and a thickness of the second semiconductor layer is 5 nm or more and 50 nm or less.

10. The active matrix substrate according to claim 1, wherein the oxide semiconductor layers of the first TFT and the second TFTs contain In, Ga, and Zn.

11. The active matrix substrate according to claim 10, wherein the oxide semiconductor layer of each of the first TFT and the second TFTs includes a crystalline portion.

12. The active matrix substrate according to claim 10, wherein, in the oxide semiconductor layer of each of the first TFT and the second TFTs, In concentration in the first semiconductor layer is lower than In concentration in the second semiconductor layer.

13. The active matrix substrate according to claim 10, wherein, in the oxide semiconductor layer of each of the first TFT and the second TFTs, Ga concentration is higher than In concentration in the first semiconductor layer, and Ga concentration is lower than or equal to In concentration in the second semiconductor layer.

14. The active matrix substrate according to claim 10, In concentration in the second semiconductor layer of the first TFT is lower than In concentration in the second semiconductor layer of each of the second TFTs.

15. The active matrix substrate according to claim 1, wherein,
in each of the first TFT and the second TFTs, the source electrode and the drain electrode contain Cu, and
in the oxide semiconductor layer of each of the first TFT and the second TFTs, the first semiconductor layer contains Cu, and the second semiconductor layer contains substantially no Cu.

16. A method for producing the active matrix substrate according to claim 1, the method comprising:
a step (a) of providing a substrate;
a step (b) of forming a first gate electrode and a second gate electrode on the substrate;
a step (c) of forming a gate insulating layer covering the first and second gate electrodes;
a step (d) of disposing, on the gate insulating layer, a first oxide semiconductor layer at least partially overlapping the first gate electrode and disposing, on the gate insulating layer, a second oxide semiconductor layer at least partially overlapping the second gate electrode, each of the first and second oxide semiconductor layers having a stacked structure formed of a plurality of semiconductor layers including a first semiconductor layer that has a first energy gap and a second semiconductor layer that is disposed on a side of the first semiconductor layer near the substrate and that has a second energy gap smaller than the first energy gap; and
a step (e) of forming a first source electrode and a first drain electrode that are disposed on the first oxide semiconductor layer so as to be separated from each other and that are each connected to the first oxide semiconductor layer and forming a second source electrode and a second drain electrode that are disposed on the second oxide semiconductor layer so as to be separated from each other and that are each connected to the second oxide semiconductor layer,
thus forming, on the substrate, a first TFT including the first oxide semiconductor layer as an active layer and a second TFT including the second oxide semiconductor layer as an active layer,
wherein, in the step (d), the first oxide semiconductor layer and the second oxide semiconductor layer are different from each other in terms of a composition and/or a number of stacked layers so that a threshold voltage of the first TFT is greater than a threshold voltage of the second TFT.

17. The method for producing an active matrix substrate according to claim 16, wherein the step (d) includes
a step of forming a first oxide semiconductor film on the gate insulating layer and patterning the first oxide semiconductor film to remove a portion of the first oxide semiconductor film that is located in a region where the first TFT is to be formed and to leave a portion of the first oxide semiconductor film that is located in a region where the second TFT is to be formed;
a step of forming a second oxide semiconductor film and a third oxide semiconductor film in this order on the gate insulating layer and the first oxide semiconductor film; and
a step of forming the first oxide semiconductor layer from the second and third oxide semiconductor films and the second oxide semiconductor layer from the first, second, and third oxide semiconductor films by patterning the first to third oxide semiconductor films.

18. The method for producing an active matrix substrate according to claim 16,
wherein each of the first source electrode, the first drain electrode, the second source electrode, and the second drain electrode has a stacked structure including a main layer electrode and a lower layer electrode disposed on a side of the main layer electrode near the substrate, and
the step (e) includes
a step of forming a lower layer electrode film containing no Cu,
a step of forming a main layer electrode film containing Cu on the lower layer electrode film,
a step of forming the main layer electrode by wet etching the main layer electrode film, and
a step of forming the lower layer electrode by dry etching the lower layer electrode film.

19. The method for producing an active matrix substrate according to claim 16, wherein the first and second oxide semiconductor layers contain In, Ga, and Zn.

20. The method for producing an active matrix substrate according to claim 19, wherein each of the first and second oxide semiconductor layers includes a crystalline portion.

* * * * *